United States Patent
Lee et al.

(10) Patent No.: US 9,720,766 B2
(45) Date of Patent: Aug. 1, 2017

(54) SELF-HEALING, FAULT-TOLERANT FPGA COMPUTATION AND ARCHITECTURE

(75) Inventors: Jeong A Lee, Seoul (KR); Baig Hasan, Karachi P.E.C.H.S (PK)

(73) Assignee: INDUSTRY-ACADEMIC COOPERATION FOUNDATION CHOSUN UNIVERSITY, Gwangju (KR)

( * ) Notice: Subject to any disclaimer, the term of this patent is extended or adjusted under 35 U.S.C. 154(b) by 267 days.

(21) Appl. No.: 14/395,755

(22) PCT Filed: Jun. 5, 2012

(86) PCT No.: PCT/KR2012/004444
§ 371 (c)(1),
(2), (4) Date: Oct. 20, 2014

(87) PCT Pub. No.: WO2013/157693
PCT Pub. Date: Oct. 24, 2013

(65) Prior Publication Data
US 2015/0082101 A1    Mar. 19, 2015

(30) Foreign Application Priority Data

Apr. 19, 2012 (KR) .......................... 10-2012-0041033
Apr. 20, 2012 (KR) .......................... 10-2012-0041626
Jun. 1, 2012 (KR) .......................... 10-2012-0059143

(51) Int. Cl.
*G06F 11/00* (2006.01)
*G06F 11/10* (2006.01)
(Continued)

(52) U.S. Cl.
CPC .......... *G06F 11/10* (2013.01); *G06F 11/2025* (2013.01); *G06F 11/2038* (2013.01);
(Continued)

(58) Field of Classification Search
CPC ... G06F 11/0724; G06F 11/0739; G06F 11/07
See application file for complete search history.

(56) References Cited

U.S. PATENT DOCUMENTS 7,797,512 B1 *  9/2010  Cheng .................... G06F 9/455
                                                        712/10
9,063,855 B2 *  6/2015  McNairy ................ G06F 11/00
(Continued)

FOREIGN PATENT DOCUMENTS

KR    10-2001-0075868 A    8/2001
KR    10-2002-0046979 A    6/2002
(Continued)

OTHER PUBLICATIONS

Monmasson, "FPGA Design Methodology for Industrial Control Systems", Aug. 2007, IEEE, vol. 54, No. 4, p. 1-19.*
(Continued)

*Primary Examiner* — Bryce Bonzo
*Assistant Examiner* — Jeison C Arcos
(74) *Attorney, Agent, or Firm* — The PL Law Group, PLLC

(57) ABSTRACT

The present invention relates to a computation cell and a self-healing, fault-tolerant FPGA architecture and, more particularly, to a computation cell and an FPGA including the same, which can detect a transient internal error or permanent internal error by inputting an original function and a spare function and comparing a prestored error detection code with a generated error detection code signal. The computation cell and the self-healing, fault-tolerant FPGA architecture of the present invention can reconfigure stem cells and look-up tables included in the computation cell and can output a normal output signal even if a transient error or a permanent error is generated in an computation cell such (Continued)

that the corresponding computation cell and an computation tile can be normally operated.

16 Claims, 23 Drawing Sheets

(51) Int. Cl.
    *G06F 11/20*     (2006.01)
    *H03K 19/173*     (2006.01)
    *H03K 19/177*     (2006.01)

(52) U.S. Cl.
    CPC ....... *G06F 11/2051* (2013.01); *H03K 19/173* (2013.01); *H03K 19/17764* (2013.01)

(56) References Cited

U.S. PATENT DOCUMENTS

| | | | |
|---|---|---|---|
| 9,274,582 B2* | 3/2016 | Mangione-Smith | |
| 2007/0074011 A1* | 3/2007 | Borkar | G06F 1/3203 712/227 |
| 2007/0282572 A1* | 12/2007 | Larus | G06F 9/5066 703/2 |
| 2008/0005539 A1* | 1/2008 | Velhal | G06F 11/008 712/220 |
| 2009/0094481 A1* | 4/2009 | Vera | G06F 1/206 714/11 |
| 2010/0153700 A1* | 6/2010 | Capps, Jr. | G06F 9/3842 713/100 |
| 2010/0281134 A1* | 11/2010 | Melen | G06F 11/0739 709/217 |
| 2014/0380019 A1* | 12/2014 | Wilkerson | G06F 9/3836 712/30 |
| 2015/0095701 A1* | 4/2015 | Hodgson | G06F 17/30345 714/23 |
| 2015/0095705 A1* | 4/2015 | Raj | G06F 11/0772 714/34 |
| 2015/0280748 A1* | 10/2015 | Gendler | H03M 13/13 714/755 |

FOREIGN PATENT DOCUMENTS

| | | |
|---|---|---|
| KR | 10-2008-0050908 A | 6/2008 |
| KR | 10-2010-0133194 A | 12/2010 |

OTHER PUBLICATIONS

Gusma, "Designing Fault-Tolerant Techniques for SRAM-Based FPGAs", 2004, IEEE, p. 1-11.*
International Search Report for PCT/KR2012/004444.
Office action from Korean Intellectual Property Office (KIPO) in a counterpart Korean patent application. (All the cited references are listed herein.).

* cited by examiner

| I1 | I0 | O1 | O2 |
|----|----|----|----|
| 0  | 0  | 1  | 1  |
| 0  | 1  | 1  | 0  |
| 1  | 0  | 0  | 1  |
| 1  | 1  | 0  | 0  |

Fig.11

| I3 | I2 | I1 | I0 | O1 | O2 |
|----|----|----|----|----|----|
| 0  | 0  | 0  | 0  | 0  | 0  |
| 0  | 0  | 0  | 1  | 0  | 1  |
| 0  | 0  | 1  | 0  | 0  | 1  |
| 0  | 0  | 1  | 1  | 0  | 0  |
| 0  | 1  | 0  | 0  | 1  | 0  |
| 0  | 1  | 0  | 1  | 1  | 1  |
| 0  | 1  | 1  | 0  | 1  | 1  |
| 0  | 1  | 1  | 1  | 1  | 0  |
| 1  | 0  | 0  | 0  | 1  | 0  |
| 1  | 0  | 0  | 1  | 1  | 1  |
| 1  | 0  | 1  | 0  | 1  | 1  |
| 1  | 0  | 1  | 1  | 1  | 0  |
| 1  | 1  | 0  | 0  | 0  | 0  |
| 1  | 1  | 0  | 1  | 0  | 1  |
| 1  | 1  | 1  | 0  | 0  | 1  |
| 1  | 1  | 1  | 1  | 0  | 0  |

Fig.13

| S0 | S1 | I2 | I1 | I0 | O1 | O2 |
|----|----|----|----|----|----|----|
| 0 | 0 | 0 | 0 | 0 | 0 | 0 |
| 0 | 0 | 0 | 0 | 1 | 0 | 0 |
| 0 | 0 | 0 | 1 | 0 | 0 | 0 |
| 0 | 0 | 0 | 1 | 1 | 0 | 0 |
| 0 | 0 | 1 | 0 | 0 | 1 | 0 |
| 0 | 0 | 1 | 0 | 1 | 1 | 0 |
| 0 | 0 | 1 | 1 | 0 | 1 | 0 |
| 0 | 0 | 1 | 1 | 1 | 1 | 0 |
| 0 | 1 | 0 | 0 | 0 | 0 | 0 |
| 0 | 1 | 0 | 0 | 1 | 0 | 0 |
| 0 | 1 | 0 | 1 | 0 | 0 | 0 |
| 0 | 1 | 0 | 1 | 1 | 0 | 0 |
| 0 | 1 | 1 | 0 | 0 | 1 | 0 |
| 0 | 1 | 1 | 0 | 1 | 1 | 0 |
| 0 | 1 | 1 | 1 | 0 | 1 | 0 |
| 0 | 1 | 1 | 1 | 1 | 1 | 0 |
| 1 | 0 | 0 | 0 | 0 | 0 | 0 |
| 1 | 0 | 0 | 0 | 1 | 0 | 0 |
| 1 | 0 | 0 | 1 | 0 | 1 | 0 |
| 1 | 0 | 0 | 1 | 1 | 1 | 0 |
| 1 | 0 | 1 | 0 | 0 | 0 | 0 |
| 1 | 0 | 1 | 0 | 1 | 0 | 0 |
| 1 | 0 | 1 | 1 | 0 | 1 | 0 |
| 1 | 0 | 1 | 1 | 1 | 1 | 0 |
| 1 | 1 | 0 | 0 | 0 | 0 | 1 |
| 1 | 1 | 0 | 0 | 1 | 1 | 1 |
| 1 | 1 | 0 | 1 | 0 | 0 | 1 |
| 1 | 1 | 0 | 1 | 1 | 1 | 1 |
| 1 | 1 | 1 | 0 | 0 | 0 | 1 |
| 1 | 1 | 1 | 0 | 1 | 1 | 1 |
| 1 | 1 | 1 | 1 | 0 | 0 | 1 |
| 1 | 1 | 1 | 1 | 1 | 1 | 1 |

SELF-HEALING, FAULT-TOLERANT FPGA COMPUTATION AND ARCHITECTURE

CROSS REFERENCE TO RELATED APPLICATIONS AND CLAIM OF PRIORITY

This patent application claims benefit under 35 U.S.C. 119(e), 120, 121, or 365(c), and is a National Stage entry from International Application No. PCT/KR2012/004444, filed 5 Jun. 2012, which claims priority to Korean Patent Application Nos. 10-2012-0041033, filed 19 Apr. 2012, 10-2012-0041626, filed 20 Apr. 2012, and 10-2012-0059143, filed 1 Jun. 2012, entire contents of which are incorporated herein by reference.

TECHNICAL FIELD

The present invention relates, in general, to a Field Programmable Gate Array (FPGA) computation cell and architecture and, more particularly, to a bio-inspired fault-tolerant FPGA computation cell, computation block, and computation tile and an FPGA including the computation cell, computation block, and computation tile.

BACKGROUND ART

A Field Programmable Gate Array (FPGA) is an integrated circuit implemented as an array of programmable logic blocks.

A conventional Static Random Access Memory (SRAM)-based FPGA is a spotlighted integrated circuit because of its high performance, low price, and re-programmability, and has been widely used, especially for remote control systems.

From the standpoint of the environment, such an SRAM-based FPGA may exert a major influence on circuit functionality due to the influence of emissions or radiation. For example, Single Event Effect (SSE) may cause a fault in an FPGA system because charged particles present in the air collide with silicon. Further, due to the SSE, memory devices of an FPGA implemented using Complementary metal-oxide-semiconductor (CMOS) or the like may cause transient faults or stuck-at faults depending on the amount of energy transferred by the charged particles. Such transient faults may appear to a degree in which bit inversion occurs in memory devices, whereas stuck-at faults may appear as permanent defects. In this environment, programmable devices need fault-tolerant or self-healing logic blocks to continue to operate.

SUMMARY

An object of the present invention is to provide a fault-tolerant FPGA computation cell and an FPGA including the computation cell, which enable fault-tolerant reconfiguration, and output a normal output signal even if a fault occurs in a computation cell, thus enabling the corresponding computation cell, computation block, and computation tile to be normally operated.

Another object of the present invention is to provide a self-healing fault-tolerant FPGA that corrects a fault occurring in a computation cell and is tolerant of a fault.

In accordance with an aspect of the present invention, there is provided a computation cell, including an original function/error detection code storage unit for storing an original function, or storing a error detection code-1 corresponding to the original function, and for outputting an original function output required to route the original function or a error detection code-1 required to detect an error in the original function when the original function is input; a spare function/error detection code storage unit for storing an spare function or storing a error detection code-2 corresponding to the spare function, and outputting a spare function output required to route the spare function or a error detection code-2 required to detect an error in the spare function when the spare function is input; a totally self checker for receiving the original function output, the error detection code-1, the spare function output, and the error detection code-2, determining whether a fault has occurred in the original function or the spare function, and then outputting a faulty signal_original and a faulty signal_spare; a function router/permanent error indicator for performing an operation on the original function output, the spare function output, the faulty signal_original, the faulty signal_spare, and a stem function input from a stem cell, and then outputting a function routing signal or a permanent error flag signal; and a free router for routing the permanent error flag signal.

Further, in accordance with another aspect of the present invention, there is provided a bio-inspired fault-tolerant Field Programmable Gate Array (FPGA), including a plurality of computation cells configured to receive an original function and a spare function, compare a pre-stored error detection code with a generated error detection code, and detect a transient fault or permanent fault in each computation cell; at least one stem cell connected to the computation cells and configured to, when a permanent fault occurs in a computation cell, replace functionality of the corresponding computation cell in which the permanent error has occurred; a plurality of computation tiles, each being configured such that the plurality of computation cells and a plurality of stem cells are arranged in the computation tile; and a fault-tolerant core configured to control the computation tiles.

A self-healing bio-inspired fault-tolerant FPGA according to the present invention includes a plurality of computation cells configured to receive an original function and a spare function, compare a pre-stored error detection code with a generated error detection code, and then detect a transient fault or permanent fault in each computation cell; at least one stem cell connected to the computation cells and configured to, when a permanent fault occurs in each computation cell, replace functionality of the corresponding computation cell in which the permanent fault has occurred, the stem cell being partially reconfigurable; at least one computation block in which each stem cell and the plurality of computation cells are connected and arranged in a line; a plurality of computation tiles, each being configured such that a plurality of computation blocks are arranged in a horizontal or vertical direction in the computation tile; and a fault-tolerant core for, when permanent faults occur in at least two of the plurality of computation tiles, setting priorities of the computation tiles in which the permanent faults are detected, and performing control such that the permanent faults are corrected depending on the priorities.

The bio-inspired fault-tolerant FPGA computation cell and the FPGA including the computation cell according to the embodiment of the present invention are capable of reconfiguring look-up tables included in a stem cell and a computation cell, and outputting a normal output signal even if a transient fault or a permanent fault occurs in a computation cell, thus enabling the corresponding computation cell and the corresponding computation tile to be normally operated.

Further, the bio-inspired fault-tolerant FPGA computation cell and the FPGA including the computation cell according to the embodiment of the present invention allow a core to separately control individual areas of computation tiles, thus improving efficiency.

The self-healing bio-inspired fault-tolerant FPGA according to the embodiment of the present invention is capable of reconfiguring look-up tables included in a stem cell and a computation cell, and outputting a normal output signal even if a transient fault or a permanent fault occurs in a computation cell, thus enabling the corresponding computation cell and the corresponding computation tile to be normally operated.

Further, the self-healing bio-inspired fault-tolerant FPGA according to the embodiment of the present invention allows a core to separately control individual areas of computation tiles, thus improving efficiency.

BRIEF DESCRIPTION OF DRAWINGS

FIG. 11 is a diagram showing the truth table of the fault checker shown in FIG. 10;

FIG. 13 is a diagram showing the truth table of the function router/permanent error indicator shown in FIG. 12;

DETAILED DESCRIPTION

Figure 1:
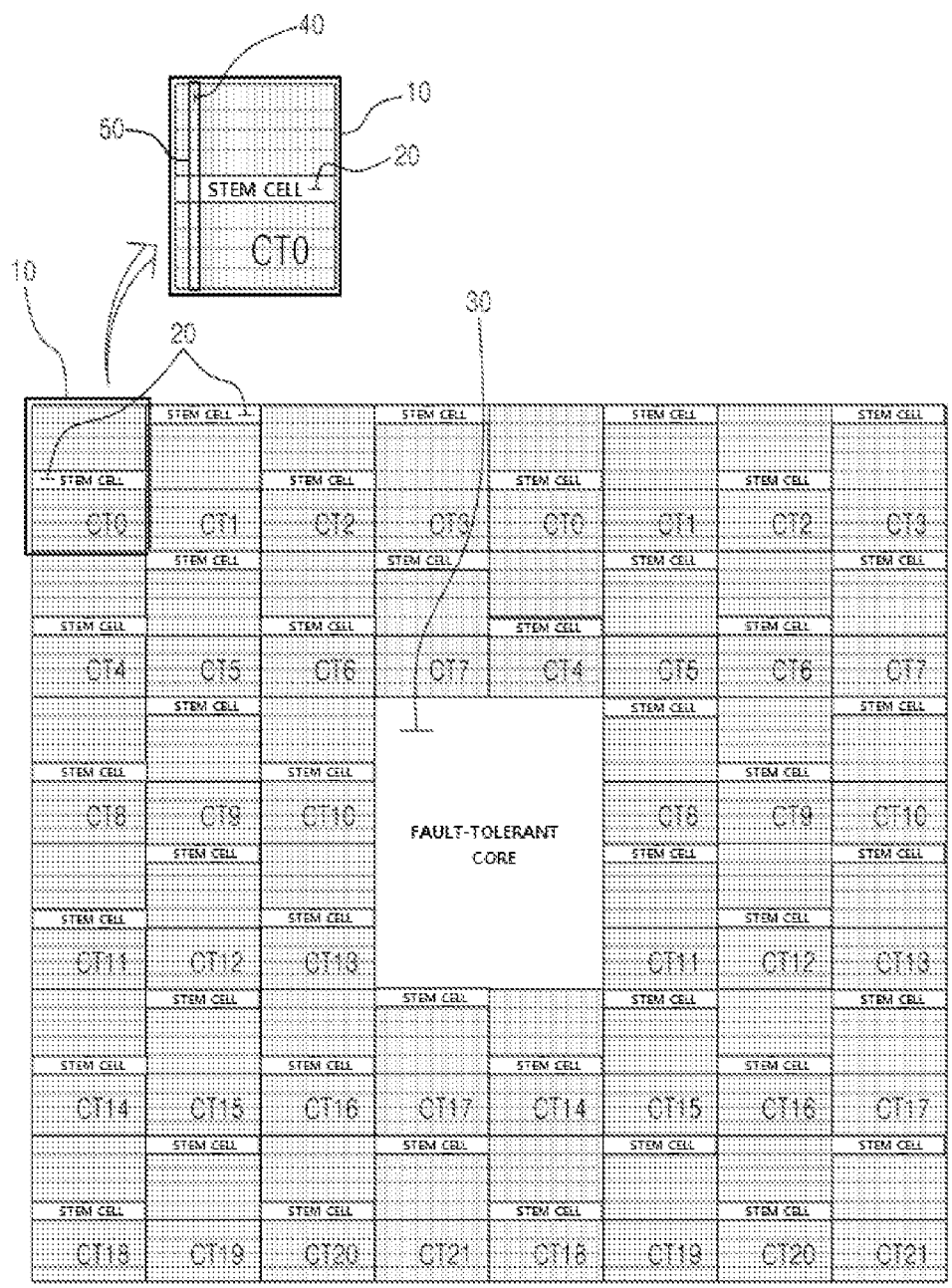
FIG. 1 is a block diagram showing an FPGA including a bio-inspired fault-tolerant FPGA computation cell according to an embodiment of the present invention.

Hereinafter, the description of the present invention made with reference to the attached drawings is not limited to specific embodiments, various modifications may be applied to the present invention, and various embodiments may be implemented. Further, details in the following description should be understood to include all modifications, equivalents, or substitutions included in the spirit and scope of the present invention.

In the following description, the terms such as "first" and "second" may be used to describe various components, but the meaning of those components should not be limited by the terms. The terms are merely used to distinguish one component from other components.

The same reference numerals are used throughout the different drawings to designate the same components.

A singular expression used in the present invention includes a plural expression unless a description to the contrary is specifically pointed out in context. Further, in the present specification, it should be understood that the terms such as "comprise", "include" or "have" are interpreted as merely indicating that features, numbers, steps, operations, components, parts, or combinations thereof are present, and are not intended to exclude a possibility that one or more other features, numbers, steps, operations, components, parts, or combinations thereof will be present or added.

Hereinafter, embodiments of the present invention will be described in detail with reference to FIGS. 1 to 10.

A bio-inspired fault-tolerant FPGA according to an embodiment of the present invention enables fault-tolerant reconfiguration, and outputs a normal output signal even if a fault occurs in a computation cell, thus enabling the corresponding computation cell, computation block, and computation tile to be normally operated. For this, the FPGA may identify unidirectional faults via self-checking on input functions and may then be tolerant of such faults.

An input function used in the following description may be defined as any Boolean function. Further, an original function is defined as any Boolean function, and a spare function is a function that will replace the original function when a fault occurs in the original function, and is a function represented by the same look-up table as that of the original function.

FIG. 1 is a block diagram showing an example of a bio-inspired fault-tolerant FPGA according to an embodiment of the present invention.

Referring to FIG. 1, the bio-inspired fault-tolerant FPGA according to the present invention may include stem cells 20, computation cells 40, computation blocks 50, computation tiles 10, and a core 30.

In detail, the stem cells 20 are empty areas in which programming information is neither input nor stored, and may input software or a program to be recorded in the FPGA from an external user. A stem cell 20 is individually connected to computation cells 40 in each computation block 50, and may provide a stem function Fn_stem. Here, the stem function Fn_stem may be a function in which pieces of input data applied from the outside to the stem cell 20 are internally reprocessed or rearranged.

Stem cells 20 may be arranged in each computation tile 10 in the direction of rows or columns. Stem cells 20 may be arranged in the same line in a single computation tile 10. Stem cells 20 in a certain computation tile 10 are arranged in a line different from that of stem cells in an adjacent computation tile 10 so that the outermost computation cells of the computation tiles 10 can be connected to each other. For examples, as shown in FIG. 1, the stem cells 20 included in "CT0" and "CT1" arranged in a left area are arranged in different lines.

When a permanent error occurs in a computation cell 40 arranged in the same computation block 50 as that of a stem cell 20, the stem cell 20 may replace the corresponding computation cell 40. Accordingly, even if a permanent error occurs in a certain computation cell 40, this error is not recognized as an error in the entirety of the corresponding computation block 50 or computation tile 10.

Each computation cell 40 is designed to be reconfigurable because it is configured to include a plurality of look-up tables. Further, the computation cell 40 may be configured to self-detect a fault in input data (hereinafter referred to an 'input function'), thus detecting a transient error or a permanent error occurring in the computation cell. For example, the computation cell 40 may include a totally self checker and may then check a transient error and a permanent error in the computation cell 40 by detecting a fault in the input function.

In addition, the computation cell 40 may include a free router and may then route the input function, fault information, etc. to its neighboring computation cell 40. Details of the computation cell 40 will be described later with reference to FIGS. 2 to 14.

Each computation block 50 may include at least one stem cell 20 and a plurality of computation cells 40. For example, in the case of CT0 shown in FIG. 1, the computation block 50 may include one center stem cell 20, four computation cells 40 arranged above the stem cell 20, and four computation cells 40 arranged below the stem cell 20, along the vertical direction of the computation tile 10. In the case of CT1, the computation block 50 may include one stem cell 20 at an uppermost location and eight computation cells 40 vertically arranged below the stem cell 20.

Each computation tile 10 may include a plurality of computation blocks 50. Here, the computation tile 10 may individually store a program and may be controlled by the fault-tolerant core 30.

The computation tiles 10 may have unique IDs for respective locations so as to identify the computation tile 10 where a permanent fault has occurred. As shown in FIG. 1, the computation tiles 10 may have unique IDs ranging from left CT0 to CT21 and unique IDs ranging from right CT0 to CT21.

Further, unique IDs may be assigned to computation tiles 10 respectively arranged in vertically divided areas.

Furthermore, in addition to a case where the computation tiles are identified for two divided two areas, the computation tiles may be identified for four divided areas, and then unique IDs may be assigned to the respective areas. This may be considered and determined upon designing an FPGA, and unique IDs may be assigned to computation tiles 10 located in respective areas when the tiles are divided into a various number of areas other than the two or four areas.

The fault-tolerate core 30 may be arranged at the center of the FPGA. The fault-tolerant core 30 may control the computation tiles 10. As described above, the fault-tolerant core 30 may perform control for individual division areas of the FPGA and improve control efficiency.

Figure 2:
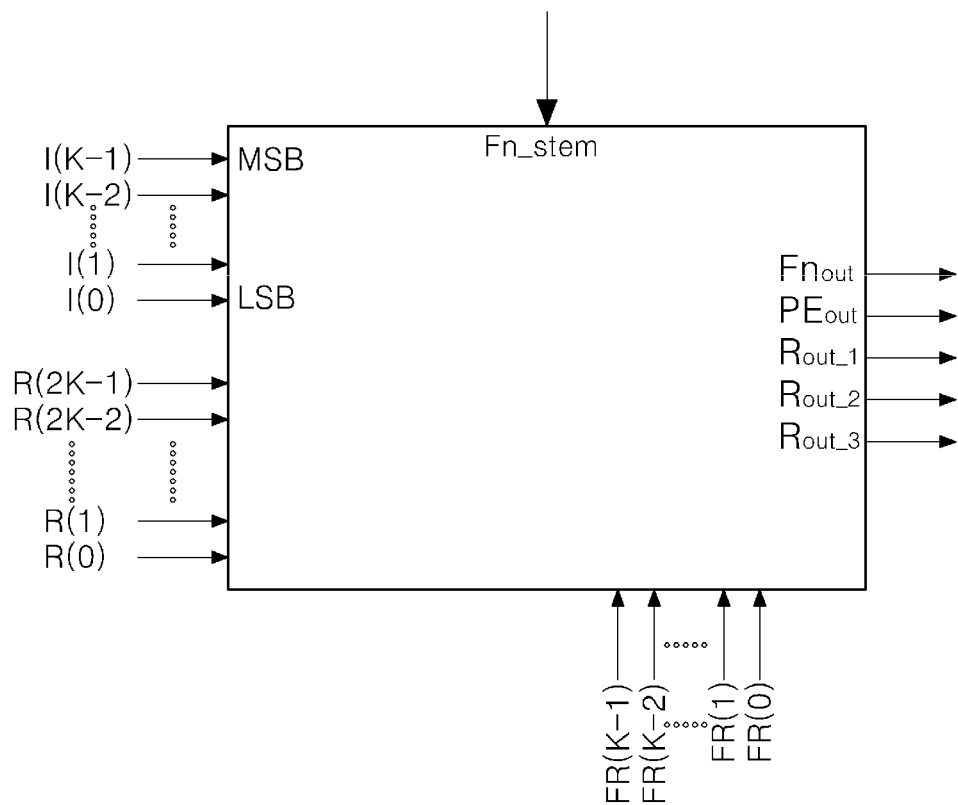
FIG. 2 is a block diagram showing a relation between the input and output of signals of a computation cell shown in FIG. 1.
Figure 3:
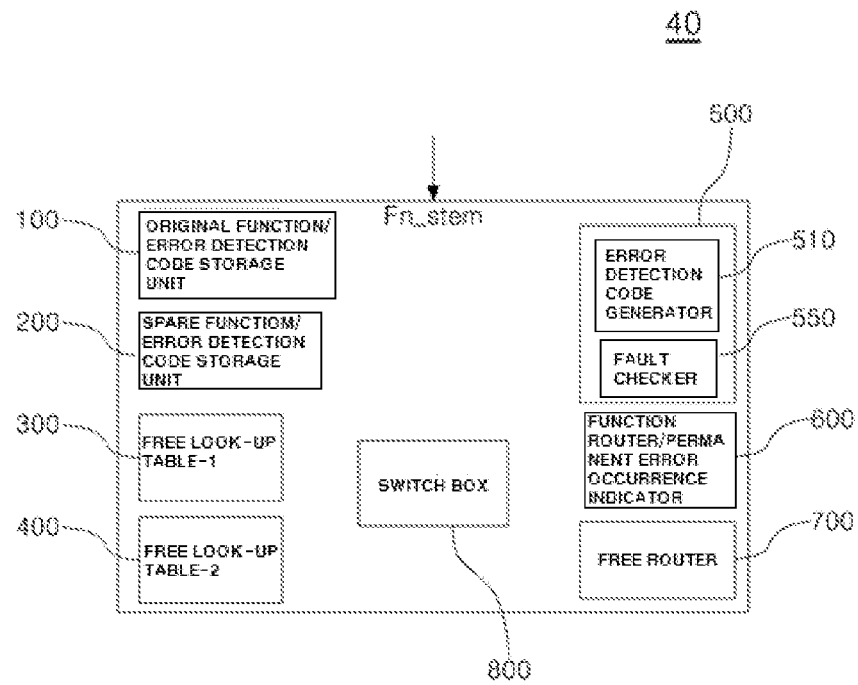
FIG. 3 is a block diagram schematically showing the functional units of the computation cell shown in FIG. 1.

FIG. 2 is a block diagram showing a relation between the input and output of signals of a computation cell shown in FIG. 1, and FIG. 3 is a block diagram schematically showing the functional units of the computation cell shown in FIG. 1.

Referring to FIGS. 2 and 3, the computation cell according to the present invention includes an original function/error detection code storage unit 100, a spare function/error detection code storage unit 200, a free look-up table-1 300, a free look-up table-2 400, a totally self checker 500, a function router/permanent error indicator 600, a free router 700, and a switch unit 800.

In detail, the original function/error detection code storage unit 100 is configured to, when an original function is input through a plurality of input ports, output an original function output Fn_O_out required to route the original function or a pre-stored error detection code-1 to check original function PS_EDC_1 required to detect an error in the original function.

For this operation, the original function/error detection code storage unit 100 may be composed of at least one look-up table (LUT), which may store $2^{k-1} \times 1$ functions.

When the original function is input, the original function/error detection code storage unit 100 may compare the input original function with stored original function information, and may then output the original function output Fn_O_out. Further, the original function/error detection code storage unit 100 may output a pre-stored error detection code-1 PS_EDC_1 required to detect an error in the original function.

When the input original function is a k−1-bit function, the original function/error detection code storage unit 100 may provide the original function output Fn_O_out and the error detection code-1 PS_EDC_1 to the totally self checker 500. Here, k bits may be defined as the number of bits of the original function.

Here, the original function output Fn_O_out is a signal for routing the original function to another computation cell 40, and the error detection code-1 PS_EDC_1 is a signal for error detection of the original function.

The above embodiment describes a case where a k−1-bit signal is input as the original function by way of example. However, when the original function is a k-bit function, the original function/error detection code storage unit 100 itself may be used as a storage unit for storing the original function. This case will be described again later.

When a spare function is input, the spare function/error detection code storage unit 200 may output a spare function output Fn_sp_out required to route the spare function or apre-stored error detection code-2 to check spare function PS_EDC_2 required to detect an error in the spare function.

The spare function/error detection code storage unit 200 may be composed of at least one look-up table (LUT), which may store $2^{k-1} \times 1$ functions. Here, k denotes the number of input bits of the spare function.

When the spare function is input, the spare function/error detection code storage unit 200 may compare the input spare function with a stored spare function and may then output the spare function output Fn_sp_out. Further, when the spare function is input, the spare function/error detection code storage unit 200 may output the pre-stored error detection code-2 PS_EDC_2.

When the input spare function is a k−1-bit function, the spare function/error detection code storage unit 200 may provide the spare function output Fn_sp_out and the error detection code-2 PS_EDC_2 to the totally self checker 500.

Here, the spare function output Fn_sp_out is a signal for routing the spare function to another computation cell 40 and the error detection code-2 PS_EDC_2 is a signal for error detection of the spare function.

The above embodiment describes a case where a k−1-bit signal is input as the spare function by way of an example. However, when the spare function is a k-bit function, the spare function/error detection code storage unit 200 itself may be used as a storage unit for storing the spare function. This case will be described again later.

The free look-up table-1 300 may be used as an internal router. The functionality of the free look-up table-1 300 may be changed according to the original function. For example, when the original function is a function of k−1 or less bits, the free look-up table-1 functions as the internal router. However, when the original function is a k-bit function, the free look-up table-1 300 stores a error detection code-1 PS_EDC_1 corresponding to the original function.

A case where the free look-up table-1 300 stores the error detection code-1 PS_EDC_1 is a case where the original function/error detection code storage unit 100 is used as a storage unit for storing the original function. In this case, since the error detection code-1 PS_EDC_1 corresponding to the original function must be stored, the functionality of the free look-up table-1 300 may be changed.

The free look-up table-2 400 may be used as an internal router. The functionality of the free look-up table-2 400 may be changed according to the spare function. For example, when the spare function is a function of k−1 or less bits, the free look-up table-2 may function as the internal router. However, when the spare function is a k-bit function, the free look-up table-2 stores a error detection code-2 PS_EDC_2 corresponding to the spare function.

A case where the free look-up table-2 400 stores the error detection code-2 PS_EDC_2 is a case where the spare function/error detection code storage unit 200 is used as a storage unit for storing the spare function. In this case, since the error detection code-2 corresponding to the spare function must be stored, the functionality of the free look-up table-2 400 may be changed.

The totally self checker 500 may generate an error detection code during the operations of the original function and the spare function, compare a pre-stored error detection code with the generated error detection code, and determine whether a fault has occurred in a cell. The totally self checker 500 may detect a transient fault or a permanent fault in the corresponding computation cell 40.

The totally self checker 500 may provide fault information to the function router/permanent error indicator 600.

The function router/permanent error indicator 600 may output computation results for a case where a faulty signal is present and a case where a faulty signal is not present. For example, the function router/permanent error indicator 600 may function as a router to route a function when a non-faulty signal is detected. Further, the function router/permanent error indicator 600 generates an error flag when a faulty signal is present.

The free router 700 may route a permanent error flag received from the corresponding computation cell 40 or a computation cell adjacent thereto.

The switch unit 800 may suitably provide signals output from the original function/error detection code storage unit 100, the spare function/error detection code storage unit 200, the free look-up table-1 300, and the free look-up table-2 400 to the totally self checker 500, the function router/permanent error indicator 600, and the free router 700.

The switch unit 800 may be manufactured at CMOS level, and may distribute suitable signals to the totally self checker 500, the function router/permanent error indicator 600, and the free router 700. The switch unit 800 may be essentially used when the totally self checker 500, the function router/permanent error indicator 600, and the free router 700 are manufactured at CMOS level.

In the computation cell 40 according to an embodiment of the present invention, each of the original function/error detection code storage unit 100, the spare function/error detection code storage unit 200, the free look-up table-1 300, and the free look-up table-2 400 shown in FIG. 3 may include a reconfigurable k−1 input look-up table. Each of the totally self checker 500, the function router/permanent error indicator 600, and the free router 700 may be fabricated at CMOS level or may be implemented in the k−1 input look-up table of the existing FPGA.

Below, embodiments of respective components will be described in detail with reference to FIGS. 4 to 14.

Figure 4:
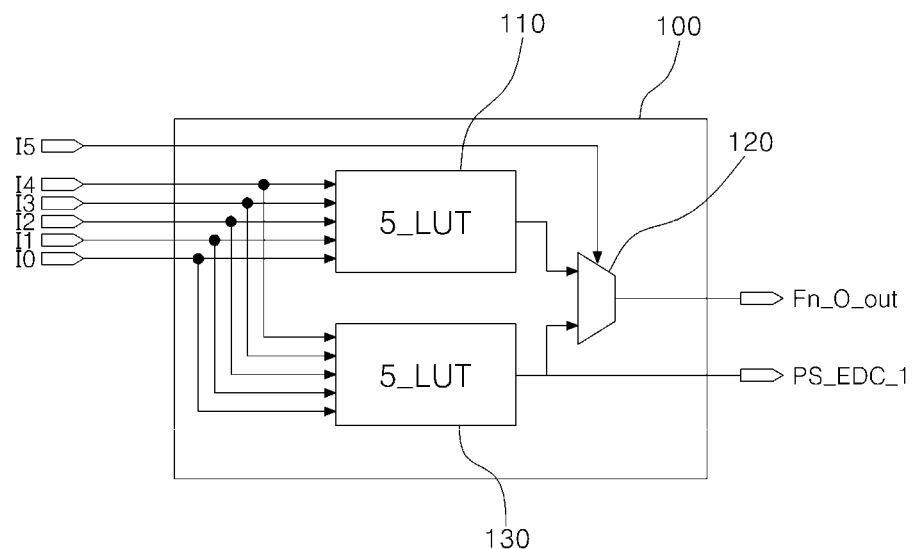
FIG. 4 is a diagram showing an example of an original function/error detection code storage unit shown in FIG. 3.

FIG. 4 is a diagram showing an embodiment of the original function/error detection code storage unit shown in FIG. 3.

Referring to FIG. 4, when a k−1-bit original function is input, the original function/error detection code storage unit 100 may output an original function output Fn_O_out or a error detection code-1 PS_EDC_1 corresponding to the original function. For this, the original function/error detection code storage unit 100 may include two look-up tables 110 and 130 and a first multiplexing unit 120.

When the original function is input through ports I0 to I4, the first look-up table 110 may output a function stored therein.

The second look-up table 130 pre-stores the error detection code-1 PS_EDC_1 corresponding to the original function, and outputs the error detection code-1 PS_EDC_1 required to detect an error in the original function input through the ports I0 to I4.

The first multiplexing unit 120 performs an operation on the Most Significant Bit (MSB) of the original function input through a port I5, a signal output from the first look-up table 110, and a signal output from the second look-up table 130, and then outputs the original function output Fn_O_out.

Meanwhile, in the original function/error detection code storage unit 100, when the original function is a k-bit function, the first look-up table 110 and the second look-up table 120 may be used as function storage units for storing the original function. In this case, the original function/error detection code storage unit 100 may store $2^k$ functions.

Figure 5:
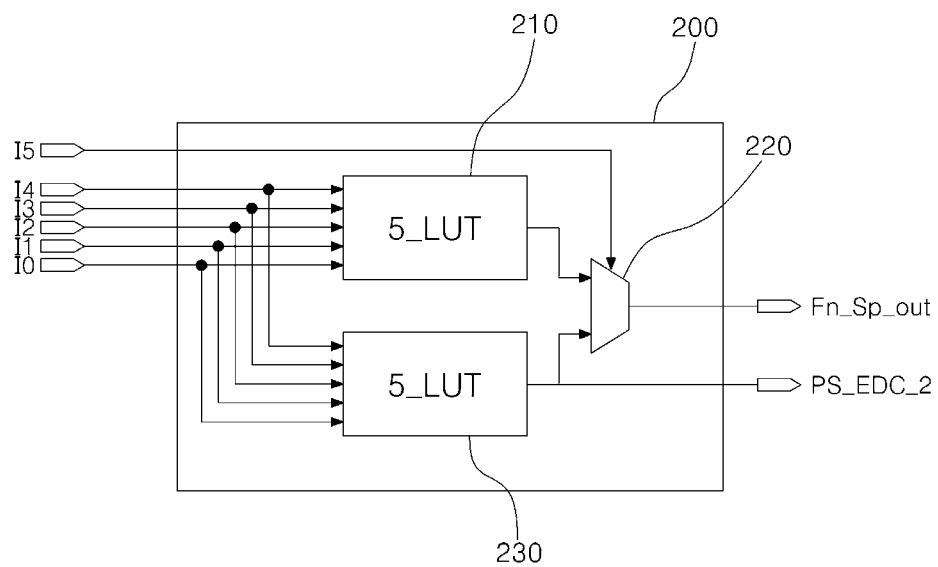
FIG. 5 is a diagram showing an example of a spare function/error detection code storage unit shown in FIG. 3.

FIG. 5 is a diagram showing an example of the spare function/error detection code storage unit shown in FIG. 3.

Referring to FIG. 5, when a k−1-bit spare function is input, the spare function/error detection code storage unit 200 may output a spare function output Fn_Sp_out or a error detection code-2 PS_EDC_2 corresponding to the spare function. For this, the spare function/error detection code storage unit 200 may include two look-up tables 210 and 230 and a second multiplexing unit 220.

The spare function/error detection code storage unit 200 may be formed in the same structure as the spare function/error detection code storage unit 200 shown in FIG. 4.

When a spare function is input through ports I0 to I4, the third look-up table 210 may output a value stored in the third look-up table 210.

The fourth look-up table 230 may store a error detection code-2 PS_EDC_2 corresponding to the spare function, and output the error detection code-2 PS_EDC_2 required to detect an error in the spare function input through the ports I0 to I4.

The second multiplexing unit 220 performs an operation on the MSB of the spare function input through a port I5, a signal output from the third look-up table 210, and a signal output from the fourth look-up table 230, and then outputs the spare function output Fn_sp_out.

Meanwhile, in the spare function/error detection code storage unit 200, when the spare function is a k-bit function, the third look-up table 210 and the fourth look-up table 230 may be used as function storage units for storing the spare function. In this case, the spare function/error detection code storage unit 200 may store $2^k$ functions.

Figure 6:
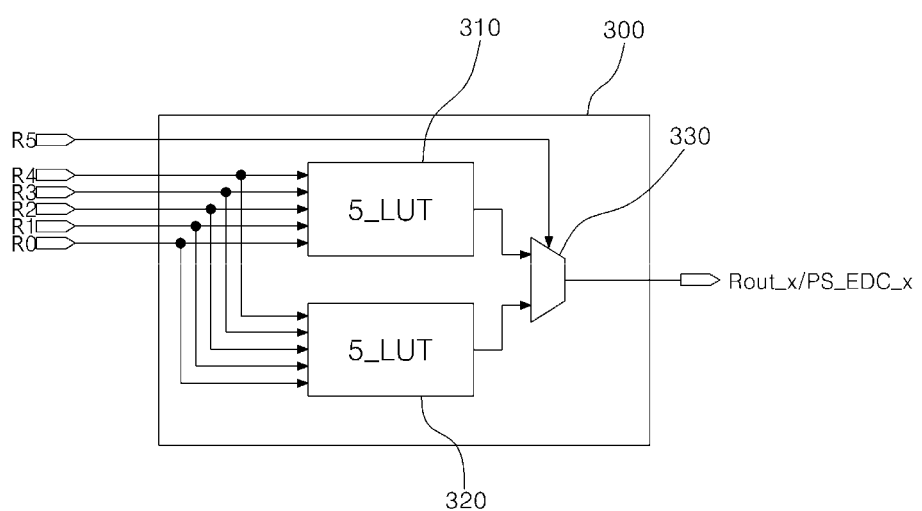
FIG. 6 is a block diagram showing a free look-up table-1 shown in FIG. 3.

FIG. 6 is a block diagram showing the free look-up table-1 shown in FIG. 3.

Referring to FIG. 6, the free look-up table-1 300 may include two look-up tables 310 and 320 and a single multiplexing unit 330.

The free look-up table-1 300 may perform two functionalities. An original functionality is the functionality as a router in a tile, and a spare functionality is the functionality of storing and outputting an error detection code.

Upon functioning as a tile router, the free look-up table-1 300 may perform the functionality of a tile router when an original function of k−1 or less bits is input. That is, when an original function of k−1 or less bits is input to the original function/error detection code storage unit 100, the free look-up table-1 300 may receive a k−1-bit tile routing signal and output a first routing signal Rout1 required to route a permanent error signal.

Further, when a k-bit original function is used, the free look-up table-1 300 may perform the functionality of storing and outputting an error detection code. When a k-bit function is input to the original function/error detection code storage unit 100, the free look-up table-1 300 may store an error detection code corresponding to the function. When a k-bit original function is input, the free look-up table-1 300 may output a pre-stored error detection code-1 PS_EDC_1 to detect an error in the original function.

Meanwhile, in accordance with an embodiment of the present invention, a free look-up table-2 identical to the free look-up table-1 300 may be added. The free look-up table-2 may include the same configuration as the free look-up table-1 of FIG. 6. However, the free look-up table-2 may route a permanent error signal for the spare function or output a pre-store error detection code-2 corresponding to the spare function depending on the number of bits of the spare function while operating in conjunction with the spare function/error detection code storage unit 200 of FIG. 3.

Figure 7:
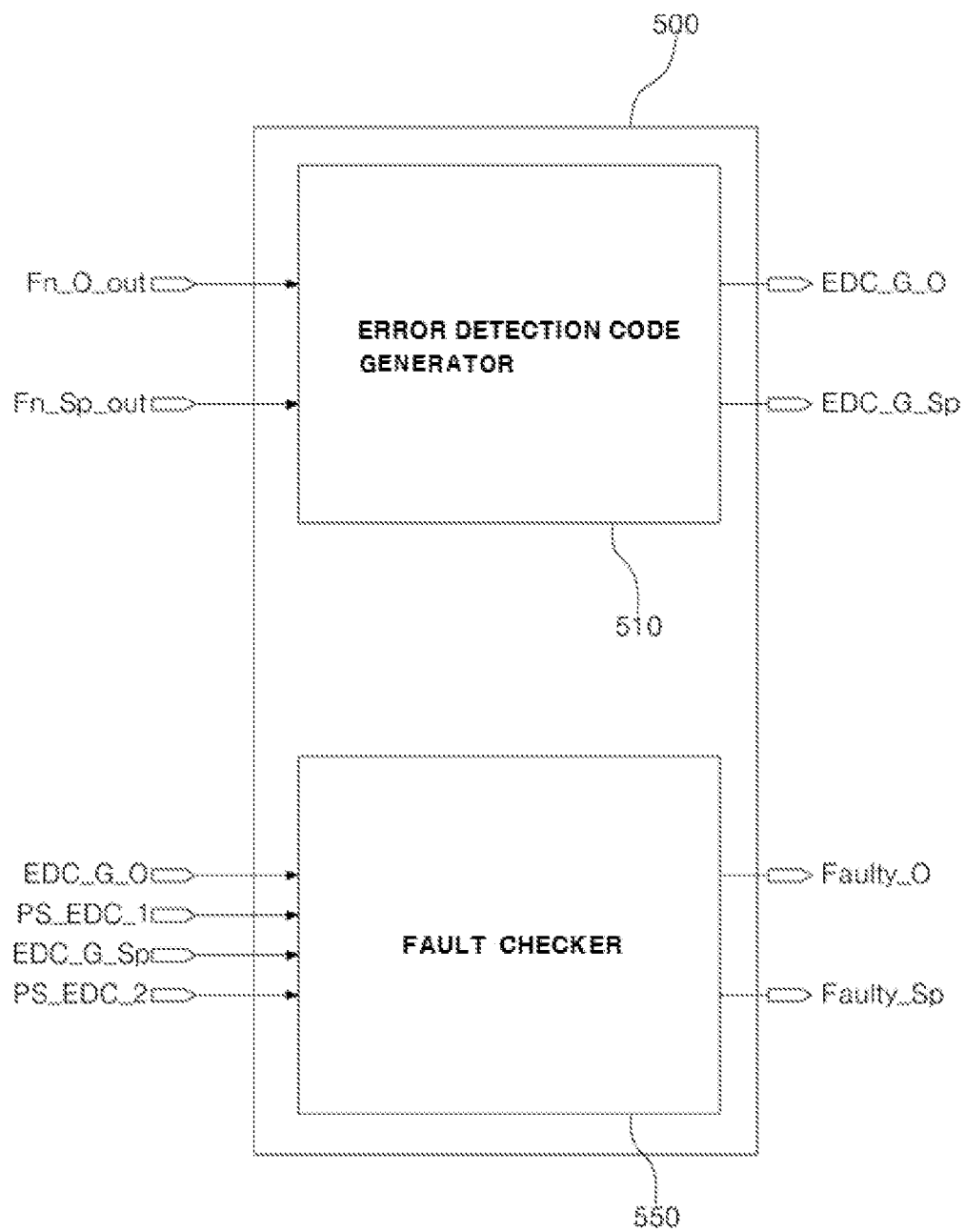
FIG. 7 is a block diagram showing an embodiment of a totally self checker shown in FIG. 3.

FIG. 7 is a block diagram showing an embodiment of the totally self checker shown in FIG. 3.

Referring to FIG. 7, the totally self checker 500 may output a faulty signal_original Faulty_O and a faulty signal_spare Faulty_Sp corresponding to the original function and the spare function, respectively.

For this, the totally self checker 500 may include an error detection code generator 510 and a fault checker 550.

When an original function output Fn_O_out and a spare function output Fn_sp_out are input, the error detection code generator 510 may output a error detection code for original function EDC_G_O and a error detection code for spare function EDC_G_Sp required to detect the occurrence of a unidirectional fault during the operations of the original and spare functions. The error detection code generator 510 provides the error detection code for original function EDC_G_O and the error detection code for spare function EDC_G_Sp to the fault checker 550.

The fault checker 550 may receive the error detection code for original function EDC_G_O, the error detection code for spare function EDC_G_Sp, a error detection code-1 PS_EDC_1, and a error detection code-2 PS_EDC_2, perform an internal operation on the signals, and output a faulty signal_original Faulty_O and a faulty signal_spare Faulty_Sp.

Below, a detailed example of the totally self checker will be described with reference to FIGS. 8 to 11.

Figures 8, 9:
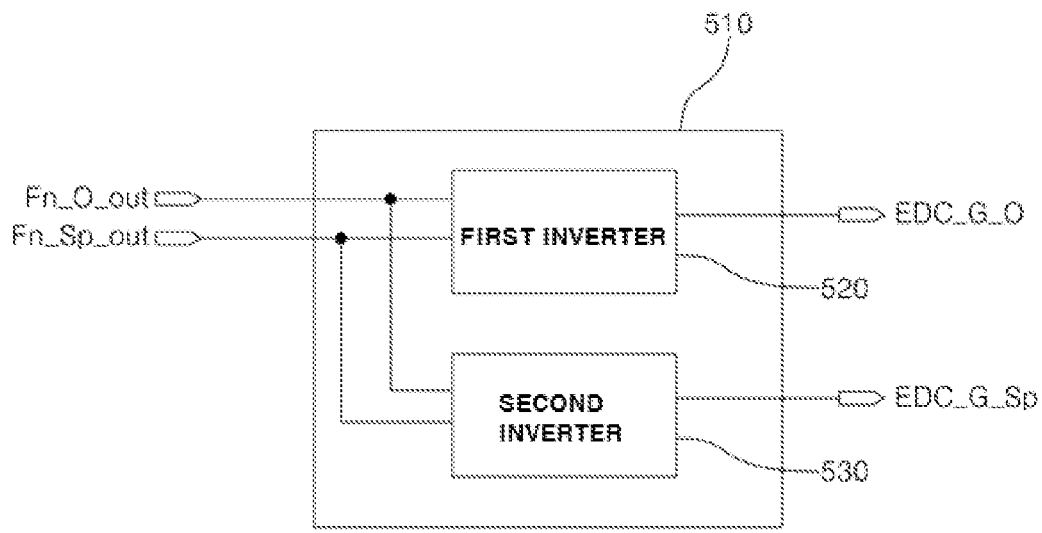
FIG. 8 is a block diagram showing an embodiment of an error detection code generator.
FIG. 9 is a diagram showing the truth table of the error detection code generator.
Figure 10:
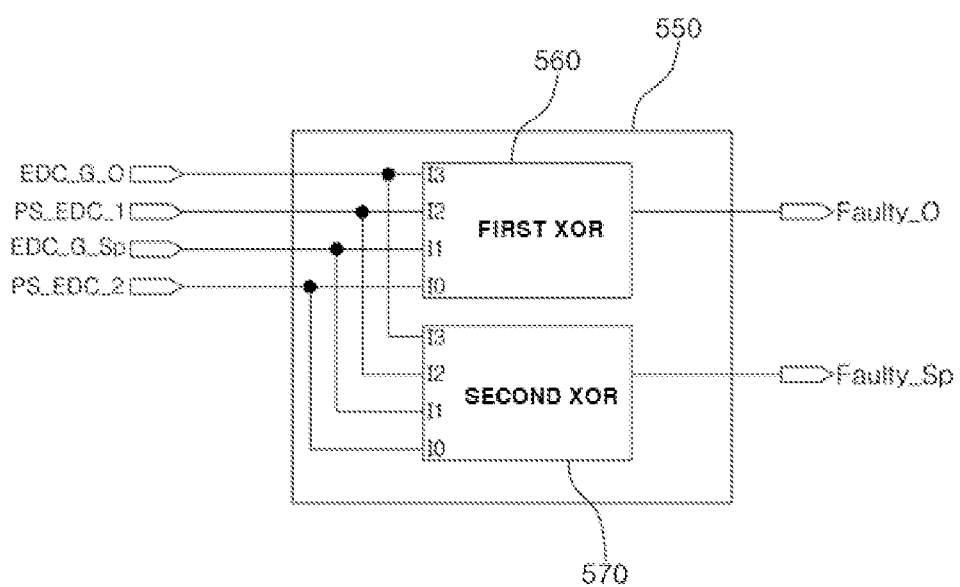
FIG. 10 is a block diagram showing an embodiment of a fault checker.

FIG. 8 is a block diagram showing an embodiment of the error detection code generator, FIG. 9 is a diagram showing the truth table of the error detection code generator, FIG. 10 is a block diagram showing an embodiment of the fault checker, and FIG. 11 is a diagram showing the truth table of the fault checker shown in FIG. 10.

Referring to FIGS. 8 and 9, the error detection code generator 510 may include a first inverter 520 and a second inverter 530. The error detection code generator 510 may generate a error detection code for original function EDC_G_O to detect the occurrence of a unidirectional fault during the operation of an original function, generate a error detection code for spare function EDC_G_Sp to detect the occurrence of a unidirectional fault during the operation of a spare function, and output the generated codes.

The first inverter 520 may invert an input original function output Fn_O_out and generate the error detection code for original function EDC_G_O, as given by the following Equation 1:

$$O1=\overline{I1} \qquad \text{Equation 1}$$

The second inverter 530 may invert an input spare function output Fn_sp_out and generate the error detection code for spare function EDC_G_Sp, as given by the following Equation 2:

$$O2=\overline{I0} \qquad \text{Equation 2}$$

In the error detection code generator 510, when both the original function output Fn_O_out and the spare function output Fn_sp_out are 0, the first inverter 520 outputs 1 and the second inverter 530 outputs 1.

Further, in the error detection code generator 510, when the original function output Fn_O_out is 0 and the spare function output Fn_sp_out is 1, the first inverter 520 outputs 1 and the second inverter 530 outputs 0.

Furthermore, in the error detection code generator 510, when the original function output Fn_O_out is 1 and the spare function output Fn_sp_out is 0, the first inverter 520 outputs 0 and the second inverter 530 outputs 1.

Furthermore, in the error detection code generator 510, when both the original function output Fn_O_out and the spare function output Fn_sp_out are 1, the first inverter 520 outputs 0 and the second inverter 530 also outputs 0.

As described above, the first inverter 520 of the error detection code generator 510 may invert the original function output Fn_O_out and output the error detection code for original function EDC_G_O, and the second inverter 530 may invert the spare function output Fn_sp_out and output the error detection code for spare function EDC_G_Sp.

Here, the error detection code for original function EDC_G_O and the error detection code for spare function EDC_G_Sp are provided to the fault checker 550.

Referring to FIGS. 10 and 11, the fault checker 550 may include two Exclusive OR (XOR) operation units 560 and 570.

The fault checker 550 may receive a error detection code for original function EDC_G_O, a error detection code for spare function EDC_G_Sp, a error detection code-1 PS_EDC_1, and a error detection code-2 PS_EDC_2 and output a faulty signal_original Faulty_O and a faulty signal_spare Faulty_Sp. Here, the faulty signal_original Faulty_O may be a code signal indicating a fault in the original function, and the faulty signal_spare Faulty_Sp may be a code signal indicating a fault in the spare function.

The first XOR operation unit 560 may receive the four input signals, perform an XOR operation on the four input signals, and then output the faulty signal_original Faulty_O. The second XOR operation unit 570 may receive the four input signals, perform an XOR operation on the four input signals, and then output the faulty signal_spare Faulty_Sp.

In this regard, the first XOR operation unit 560 may output the faulty signal_original Faulty_O based on signals related to the original function.

The first XOR operation unit 560 may perform an XOR operation, as given by the following Equation 3, and output the faulty signal_original Faulty_O through an output port O1.

$$O1 = I3 \oplus I2 \qquad \text{Equation 3}$$

Depending on the error detection code for original function EDC_G_O and the pre-stored error detection code-1 to check original function PS_EDC_1 that are input through the input ports I2 and I3 of the first XOR gate 560, the first XOR gate 560 may output a value of 0 or 1. As shown in FIG. 11, when both the signals input through the input ports I2 and I3 are 0 or 1, 0 may be output through the output port. However, when signals input through the input ports I2 and I3 are different from each other, 1 is output through the output port.

Accordingly, the first XOR operation unit 560 may detect whether a fault is present in the original function.

The second XOR operation unit 570 may receive the four input signals, perform an XOR operation on the input signals, and then output the faulty signal_spare Faulty_Sp.

The second XOR operation unit 570 may output a faulty signal based on the signals related to the spare function, as given by the following Equation 4.

$$O2 = I1 \oplus I0 \qquad \text{Equation 4}$$

That is, depending on the error detection code for spare function EDC_G_Sp and the error detection code-2 PS_EDC_2 input through the input ports I0 and I1 of the second XOR operation unit 570, the output value may be 0 or 1. As shown in the truth table of FIG. 11 and Equation 4, when both signals input through the input ports I0 and I1 are 0 or 1, 0 may be output through the output port. However, when the signals input through the input ports I0 and I1 are different from each other, 1 may be output through the output port.

Accordingly, the second XOR operation unit 570 may output a faulty signal_spare Faulty_Sp for a fault in the spare function and provide the faulty signal_spare to the function router/permanent error indicator 600.

The above-described fault checker 550 may compare the error occurrence code with the error detection code and determine that a fault has occurred in any one of the original function and the spare function when the codes are not identical to each other. As a result, it is possible to detect a transient fault or a permanent fault occurring in each computation cell by means of functions that are input in real time.

Figure 12:
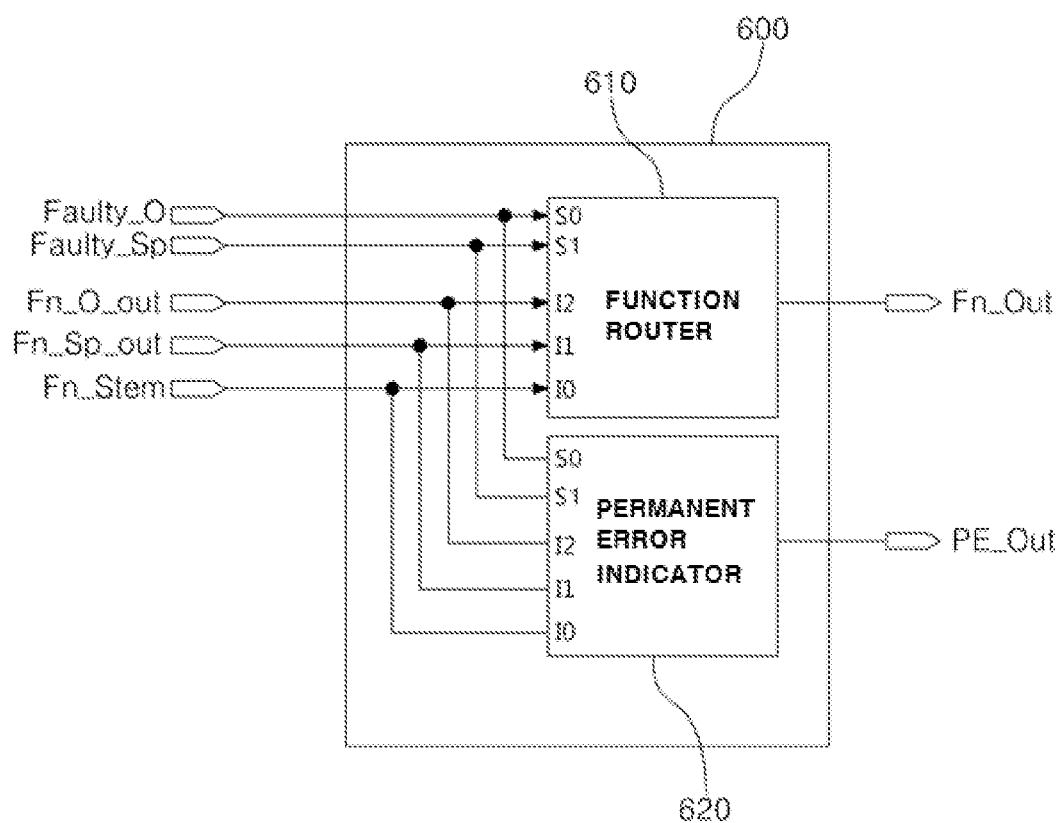
FIG. 12 is a block diagram showing a function router/permanent error indicator shown in FIG. 3.

FIG. 12 is a block diagram showing the function router/permanent error indicator shown in FIG. 3, and FIG. 13 is a diagram showing the truth table of the function router/permanent error indicator shown in FIG. 12.

Referring to FIGS. 12 and 13, the function router/permanent error indicator 600 may output either a function routing signal Fn_Out required to route a non-faulty function (faultless original function or spare function) or a permanent error flag signal PE_Out depending on the signals input from the totally self checker 500, the original function/error detection code storage unit 100, the spare function/error detection code storage unit 200, and the stem cell 20.

The function router/permanent error indicator 600 receives an original function output Fn_O_out, a spare function output Fn_sp_out, a faulty signal_original Faulty_O, a faulty signal_spare Faulty_Sp, and a stem function Fn_Stem. The function router/permanent error indicator 600 may receive the stem function Fn_Stem through an input port I0, and receive the spare function output Fn_sp_out through an input port I1, the original function output Fn_O_out through an input port I2, the faulty signal_spare Faulty_Sp through an input port S1, and the faulty signal_original Faulty_O through an input port S2. The function router/permanent error indicator 600 may perform an operation on the input signals, output the function routing signal Fn_Out when a fault is not present in the corresponding computation cell 40, and output the permanent error flag signal PE_Out when a permanent fault occurs in the computation cell 40.

For this, the function router/permanent error indicator 600 may include a function router 610 for outputting the function routing signal Fn_Out and a permanent error indicator 620 for outputting the permanent error flag signal PE_Out.

The function router 610 may be implemented as a multiplexer (MUX) and the permanent error indicator 620 may be implemented as an AND gate.

The function router 610 may receive the original function output Fn_O_out, the spare function output Fn_sp_out, the faulty signal_original Faulty_O, the faulty signal_spare Faulty_Sp, and the stem function Fn_Stem, perform an operation given by the following Equation 5 on the received signals, and output a function routing signal Fn_Out having a value of 0 or 1. Here, when 0 is output from the function router 610, the original function is routed to the outside of the computation cell 40. When 1 is output, the spare function is routed.

$$O1 = \overline{S0} \cdot \overline{S1} \cdot I2 + \overline{S0} \cdot S1 \cdot I2 + S0 \cdot \overline{S1} \cdot I1 + S0 \cdot S1 \cdot I0 \qquad \text{Equation 5}$$

$$O2 = S0 \cdot S1 \qquad \text{Equation 6}$$

Referring to Equation 5 and the truth table of FIG. 13, when neither the original function nor the spare function are faulty (S0=0, S 1=0), the function router 610 outputs 0 as the function routing signal Fn_Out required to route the original function to the outside of the computation cell 40 in response to the original function output Fn_O_out input through the input port I2.

Further, when only the spare function of the original and spare functions is faulty (S 0=0, S 1=1), the function router 610 outputs 0 as the function routing signal Fn_Out required to route the spare function to the outside of the computation cell 40 in response to the spare function output Fn_Sp_out input through the input port I0.

Here, the permanent error indicator 620 outputs 0 indicating information in which a permanent error has not occurred.

Meanwhile, when both the original function and the spare function are faulty (S 0=1, S 1=1), the function router 610 outputs the function routing signal Fn_Out, required to route a signal corresponding to the stem function Fn_Stem to the outside of the computation cell 40, as the function routing signal Fn_Out, based on Equation 5 and the truth table of FIG. 13.

In this case, as shown in Equation 6 and FIG. 13, the permanent error indicator 620 outputs 1 indicating information in which a permanent error has occurred in the corresponding computation cell.

Figure 14:
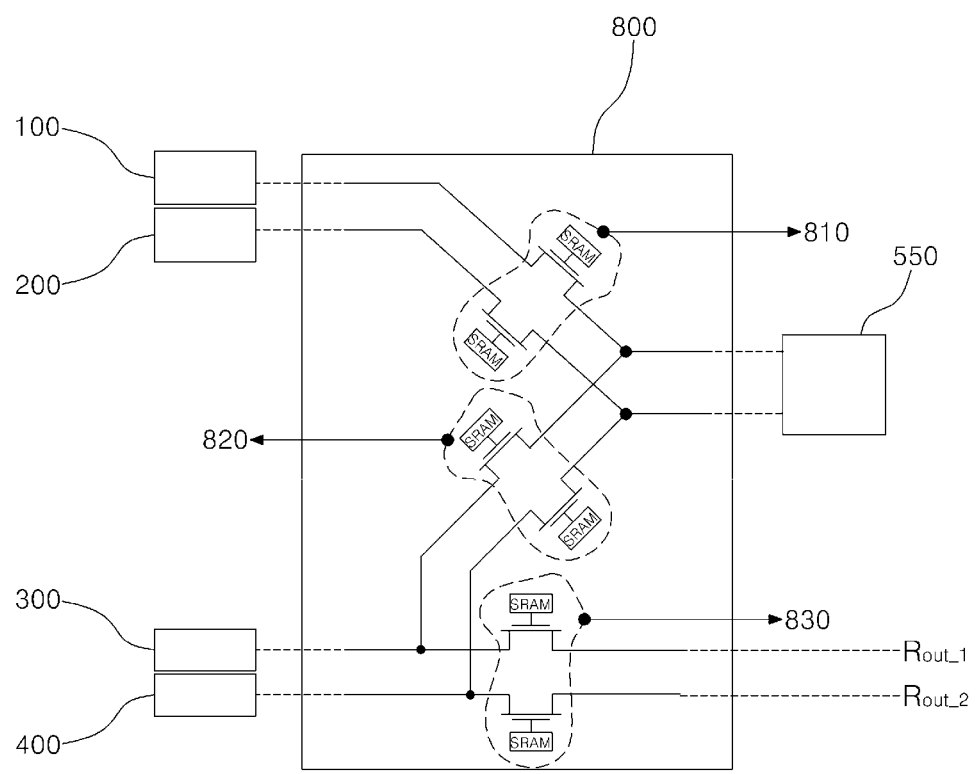
FIG. 14 is a block diagram showing a switch unit shown in FIG. 3.

FIG. 14 is a block diagram showing the switch unit shown in FIG. 3.

Referring to FIG. 14, the switch unit 800 may route the internal signals of a computation cell. The switch unit 800 may include a plurality of CMOS-based switch blocks 810 to 830.

The first switch block 810 may perform switching so that signals output from the original function/error detection code storage unit 100 and the spare function/error detection code storage unit 200 are provided to the fault checker 550.

The second switch block 820 may perform switching so that signals output from the free look-up table-1 300 and the free look-up table-2 400 are provided to the fault checker 550.

The third switch block 830 may perform switching so that the signals output from the free look-up table-1 300 and the free look-up table-2 400 are provided to the free router 700.

For example, when a k–1-input function is configured, pre-generated error detection codes PS_EDC_1 and 2 are respectively stored in the original function/error detection code storage unit 100 and in the spare function/error detection code storage unit 200. At this time, values in the SRAMs of the first and third switch blocks 800 may be set to 1, and a value in the SRAM of the second switch block 800 may be set to 0.

Meanwhile, when a k-input function is configured, pre-generated error detection codes PS_EDC_1 and 2 may be stored in the free look-up table-1 300 and the free look-up table-2, respectively. In this case, values in the SRAMs of the first switch block 800 and the third switch block 800 may be set to 0, and a value in the SRAM of the second switch block 800 may be set to 1.

As described above, the bio-inspired fault-tolerant FPGA computation cell and the FPGA including the computation cell may enable fault-tolerant reconfiguration and output a normal output signal even if a fault has occurred in each computation cell, thus enabling the corresponding computation cell, computation block, and computation tile to be normally operated.

Further, in the bio-inspired fault-tolerant FPGA, the original and spare function/error detection code storage units may be implemented using reconfigurable look-up tables, thus making it possible to detect an error in a computation cell during the reconfiguration of the system.

Figure 15:
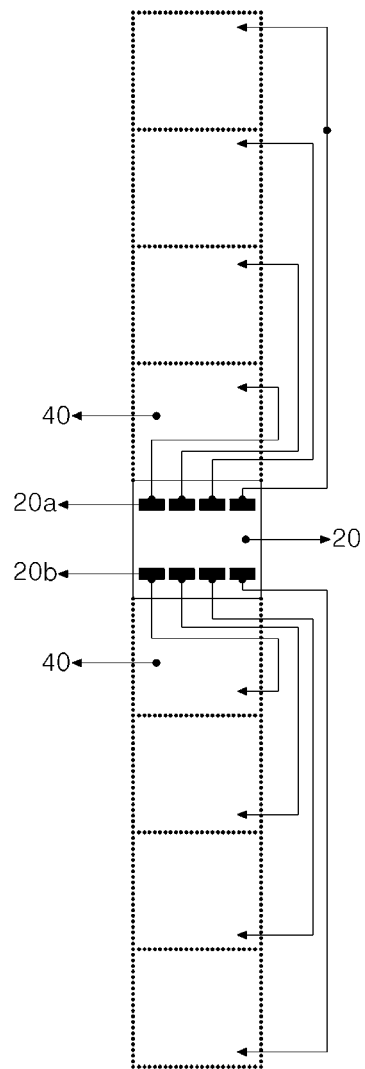
FIGS. 15 and 16 are diagrams showing connection between the stem cell and computation cells of the FPGA according to an embodiment of the present invention.
Figure 16:
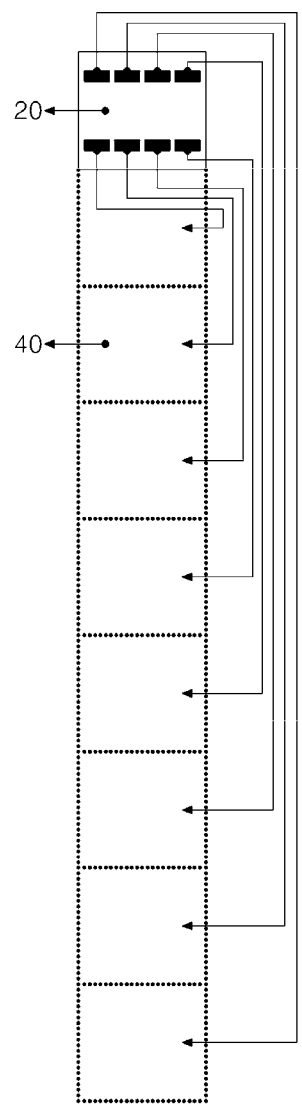

FIGS. 15 and 16 are diagrams showing a connection relation between the stem cell and computation cells of the FPGA according to an embodiment of the present invention. FIG. 15 is a diagram showing a structure in which computation cells are arranged above and below a stem cell, and FIG. 16 is a diagram showing a structure in which computation cells are arranged on one side of a stem cell.

In the embodiment of the present invention, a structure in which each stem cell is connected to eight computation cells is described as an example, but the present invention is not limited to such an example.

Referring to FIGS. 15 and 16, a stem cell 20 is individually connected to the corresponding computation cells 30, and has a number of different stem functions Fn_stem identical to the number of computation cells 40. In the present embodiment, the stem cell may include eight different stem functions. In FIG. 15, the stem cell 20 has stem functions respectively corresponding to the computation cells 40 connected to the stem cell 20. Whenever the computation cells 40 have permanent faults, such stem functions may be partially reconfigured so as to take over the functionalities of the corresponding computation cells.

Here, the width of a computation block 50 including the stem cell 20 and the computation cells 40 connected to the stem cell 20 depends on the number of look-up tables the computation cells 40 can have. In order to port such a fault-tolerant architecture to an existing FPGA, the width of the computation block depends on the number of look-up tables a Configurable Logic Block (CLB) can have. In order to port all components of the computation cells 40 to a single Configurable Logic Block (hereinafter referred to as a "CLB"), the CLB must have at least eight look-up tables.

In the present embodiment, since each computation cell 40 includes eight look-up tables, eight functions for each computation cell may be accommodated. Therefore, the size of the computation block corresponds to 8+1 (one for stem cell)=9 cells. When the FPGA according to an embodiment of the present invention is manufactured at CMOS level, the size of the computation block is determined according to the size of the stem cell 20 represented by the unit of a look-up table. In order to port the FPGA architecture of the present invention to the conventional FPGA, a single computation cell 40 may be regarded as a single CLB. A general formula in which the size of the computation block is represented by the unit of a CLB is given by the following Equation 7:

$$B = N + W \qquad \text{Equation 7}$$

where B denotes the size of the computation block, N denotes the number of look-up tables in the CLB (N=8), and W denotes the width of a configuration frame (width enabling all partition pins of the stem cell to be accommodated).

The size of the stem cell may be identical to the width of a configuration frame so that the configuration frame is suitably and partially reconfigured. Depending on the type of partial reconfiguration, the width of the stem cell may be selected. When the type is a modulo-based partial reconfiguration type, software automatically inserts proxy logic into the stem cell. The proxy logic is configured using a single look-up table 1 (LUT1), and implements a fixed interface between a static area and a reconfigurable area. In this case, the width of the stem cell must be large enough to accommodate all partition pins of the stem cell. In contrast, when a partial reconfiguration type based on a difference is used, such additional proxy logic is not required.

Figure 17:
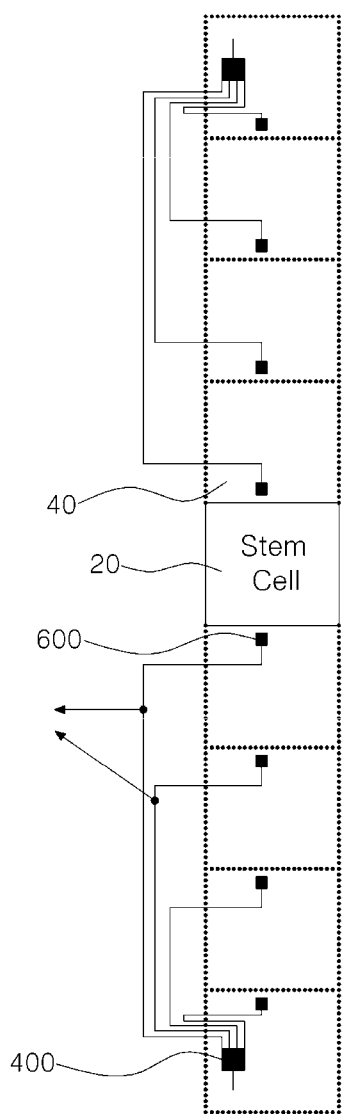
FIGS. 17 and 18 are block diagrams showing embodiments of permanent error routing in a computation block.
Figure 18:
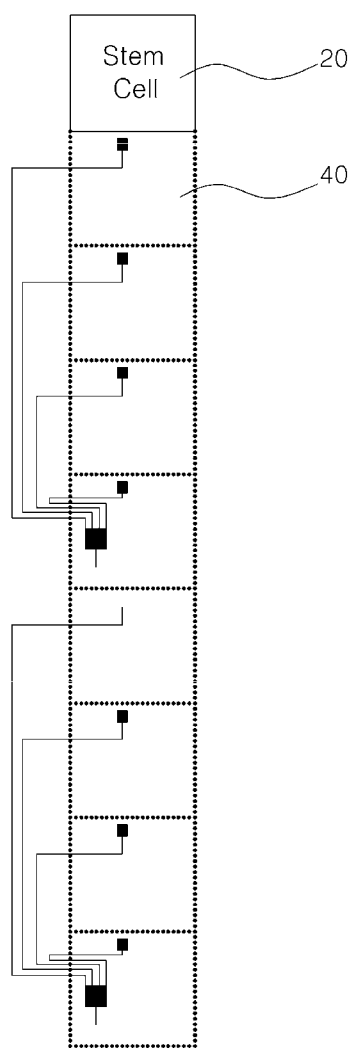

FIGS. 17 and 18 are block diagrams showing embodiments of permanent error routing in a computation block.

Each of computation cells shown in FIGS. 17 and 18 may include a function router/permanent error indicator 86, as shown in FIG. 3. FIGS. 17 and 18 illustrate paths for routing to the inputs of the free look-up table-1 300, the free look-up table-2 400, or the free router 700 shown in FIG. 2. In this case, the drawings show a case where the free look-up table-1 300 or the free look-up table-2 400 functions as a router. As shown in FIGS. 17 and 18, even in the remaining half of the computation block, the same routing path may be included. This shows that, in order to use the free look-up table-1 300 and the free look-up table-2 400 shown in FIG.

3 as routers, at least two computation cells of a single computation block must have a function with a number of inputs less than K.

Therefore, for eight computation cells in the computation block, 8−2=6 K_input functions may be implemented in the computation block. For 10 computation cells in the computation block, 10−2=8 K_input functions may be implemented in the computation block.

The number of K_input functions is represented by the following Equation 8:

$$\text{number of } K\_\text{input functions} = M - 2 \qquad \text{Equation 8}$$

where M denotes the number of computation cells in the computation block.

Figure 19:
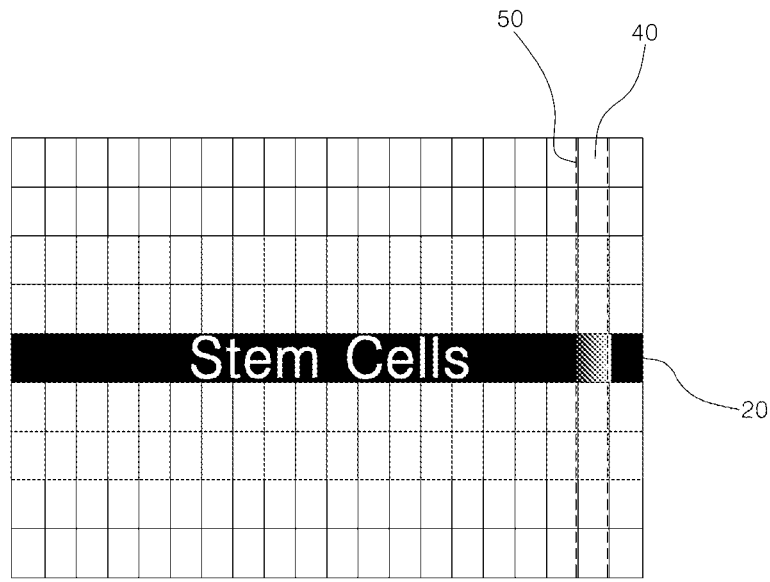
FIGS. 19 and 20 are diagrams showing two computation tiles in which the stem cells of the computation blocks shown in FIGS. 15, 16, 17, and 18 are located in two different areas.
Figure 20:
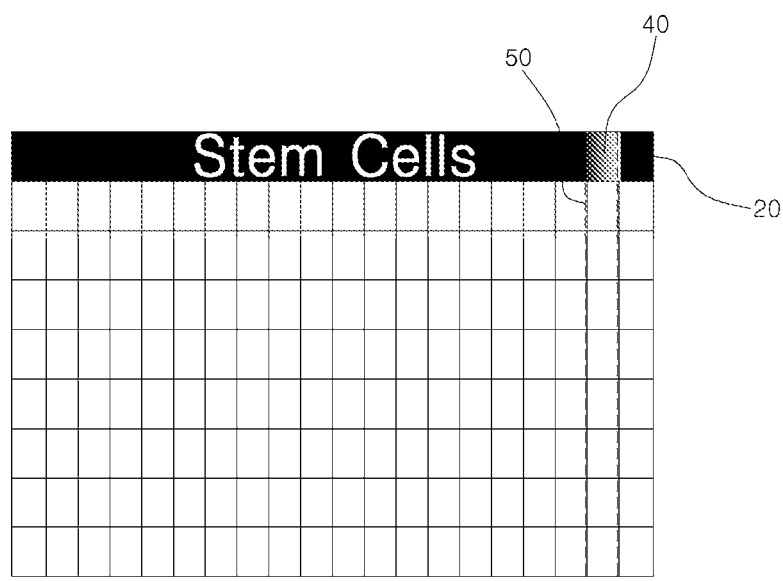

FIGS. 19 and 20 are diagrams showing two computation tiles in which the stem cells of the computation blocks shown in FIGS. 15, 16, 17, and 18 are located in two different areas.

The length of a computation tile is proportional to the length of a configuration frame. For the size of the configuration frame of 20×1 (20 CLB length×1 CLB width) and the size of the CLB of eight look-up tables, the size of the computation tile may be assumed, as given by the following Equation 9:

$$\text{Tile size} = 20 \times (8+1) = 180 \qquad \text{Equation 9}$$

As given by Equation 9, among 180 CLBs, 20 vertical CLBs may be used for stem cells, and the remaining 160 CLBs may function as computation cells. The configuration frame defines the granularity of partial reconfiguration, that is, the minimum number of CLBs that have been reconfigured during partial reconfiguration. Here, since the size of the configuration frame is 20×1 CLBs indicating a reconfigured part while a part of the device is reconfigured, at least 20×1 CLBs are reconfigured. Therefore, when there are 160 computation cells, permanent errors simultaneously occurring in all of the computation cells may be instantaneously corrected.

For the size of the configuration frame corresponding to 40×2 (40 CLB length×2 CLB width) and the CLB size corresponding to eight look-up tables, the size of the computation tile is calculated by the following Equation 10:

$$\text{size of computation tile} = 40 \times (8+2) = 400 \qquad \text{Equation 10}$$

As given by Equation 10, among 400 CLBs, 80 vertical CLBs may be used for stem cells and the remaining 320 CLBs may function as computation cells. The size of computation tile may be defined as given by the following Equation 11:

$$\text{size of computation tile} = L \times (N+W) \qquad \text{Equation 11}$$

In this case, the size of the computation tile may be converted into that of the following Equation 12, based on Equations 7 and 11:

$$\text{size of computation tile} = L \times B \qquad \text{Equation 12}$$

where L denotes the length of the configuration frame (length of reconfigurable computation cells), and B denotes the size of the computation block.

The number of stem cells (SC) in the computation tile may be calculated, using the following Equation 13:

$$SC = L \times W \qquad \text{Equation 13}$$

where L denotes the length of the configuration frame and W denotes the width of the configuration frame.

When an error occurs in one computation cell of the computation tile, all stem cells in the tile are reconfigured due to the configuration granularity of the device. Here, the reconfiguration of stem cells corresponding to computation cells without having a fault does not influence their functionalities, and the reason for this is that they are being executed during the performance of reconfiguration.

In the stem cells according to the present invention, a single flag signal indicating that a permanent error has occurred in a specific computation tile must be extracted regardless of whether the permanent error originates from a single computation cell or from a plurality of cells. Regardless of how many permanent errors are present in any computation tile, all computation tiles in which faults have occurred may be simultaneously healed of faults.

Therefore, the total number of cells in the computation tile which can be simultaneously healed of permanent errors is represented by the following Equation 14:

$$C = \text{tile size} - SC \qquad \text{Equation 14}$$

where SC denotes the number of stem cells, and the SC stem cells have a sufficient number of look-up tables so that all faults occurring in the computation tiles may be corrected.

Figure 21:
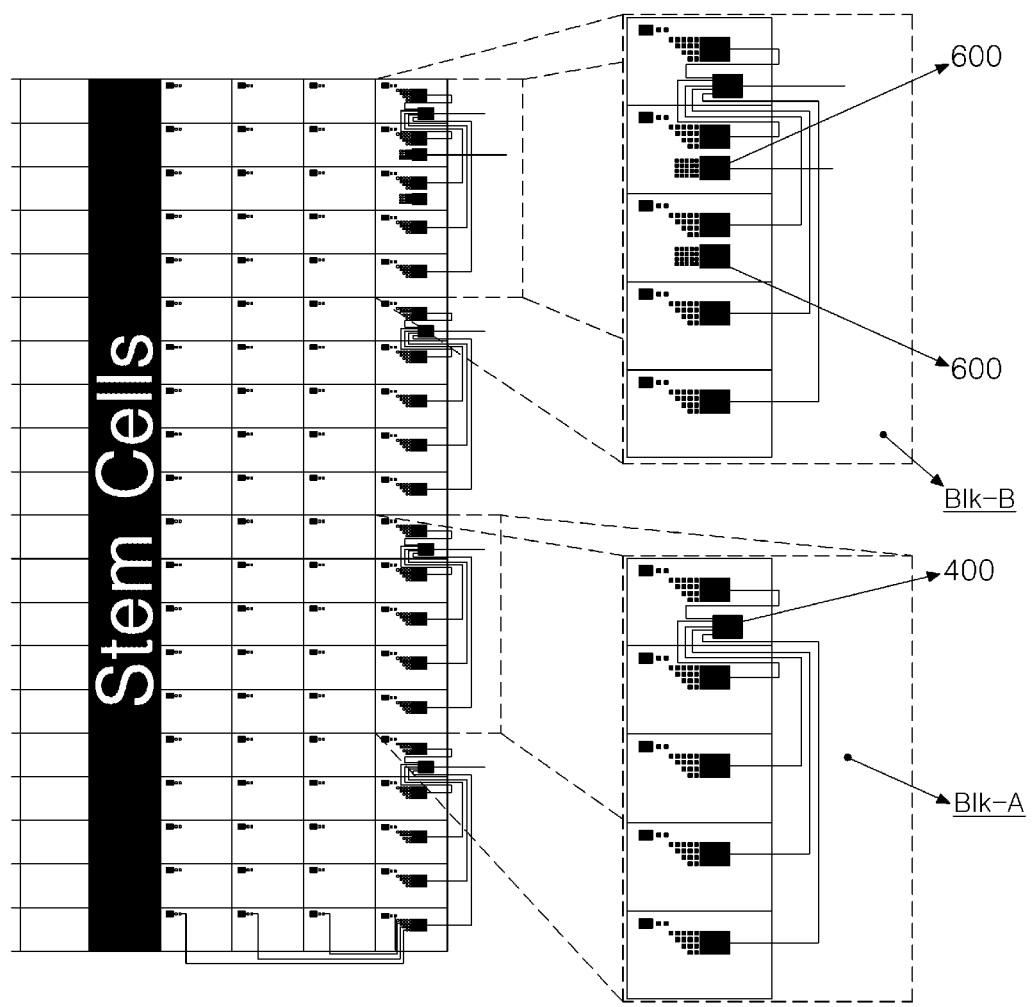
FIG. 21 is a diagram showing an intra-tile routing architecture for generating a single permanent error flag from a computation tile.

FIG. 21 is a diagram showing an intra-tile routing architecture for generating a single permanent error flag from a computation tile.

As shown in FIG. 17, a single permanent error signal is generated from each half of the computation block. Such All of such signals are routed to the free routers of computation cells located on the border of a tile. In this case, when there are 20 computation blocks, two permanent error signals will be present in such a way that one signal is generated from each half of each of the computation blocks and two signals are present for each computation block, and all signals from the tile are summed up so that a total of 40 signals will be present. Such signals are further divided into groups of five signals. Area A (Blk-A) shown in FIG. 21 shows that such five signals are input to the free look-up table-2 400 shown in FIG. 2. The number of signals output from the free look-up table-2 400 may be four corresponding to the number of signals output from each half of the computation tile. The signals are re-routed into the function router/permanent error indicator 600 shown in area B (Blk-B). In each half of the computation tile, a single signal that is input to the function router/permanent error indicator 600 is generated so as to generate a single permanent error flag from the computation tile.

In accordance with such a method for permanent error routing in a computation tile, free routers that may be easily used for different tile sizes may still be used, and thus permanent error signals generated from respective computation cells have the same routing delay.

Figure 22:
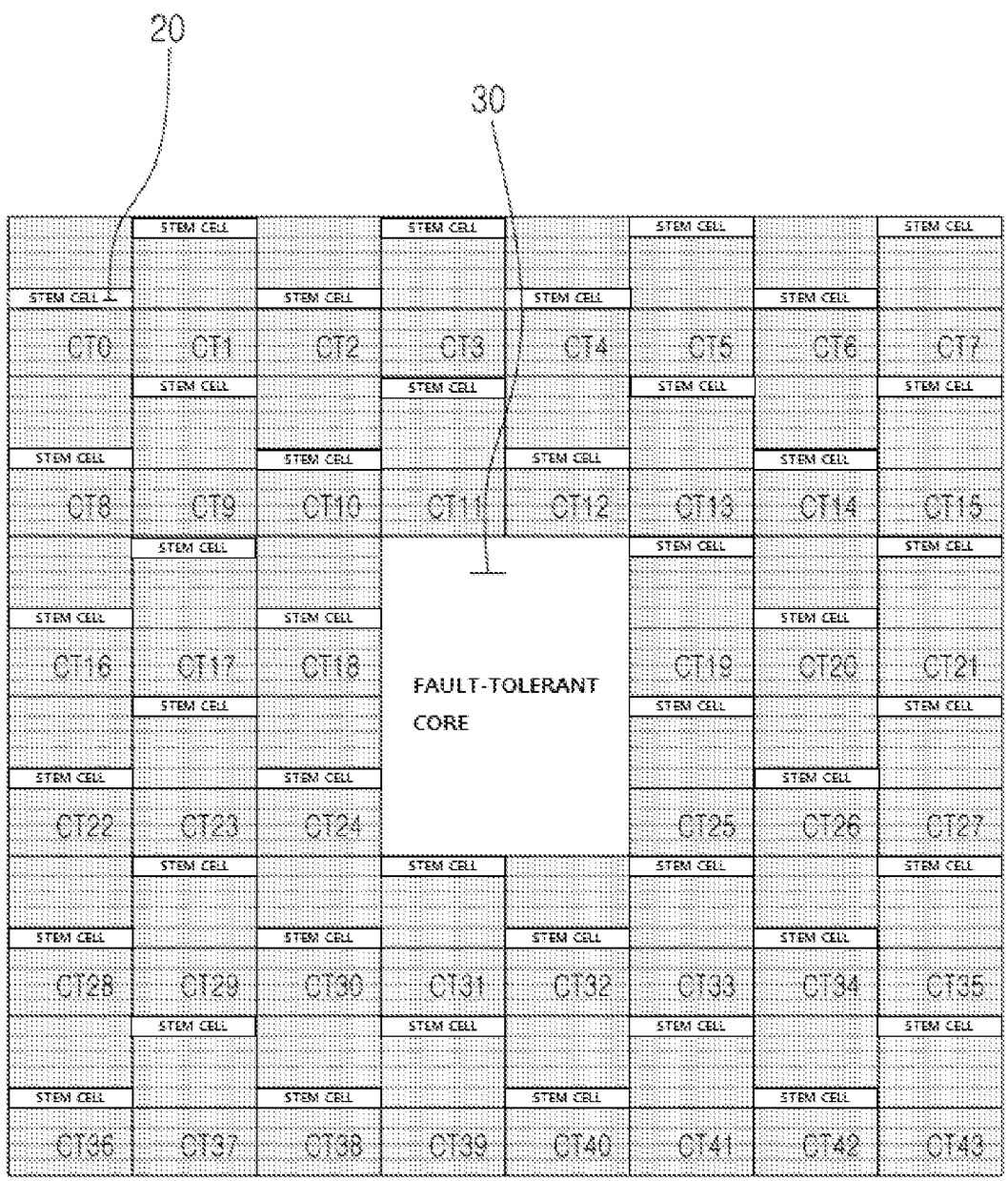
FIGS. 22 and 23 are diagrams showing a self-healing bio-inspired fault-tolerant FPGA according to embodiments of the present invention.
Figure 23:
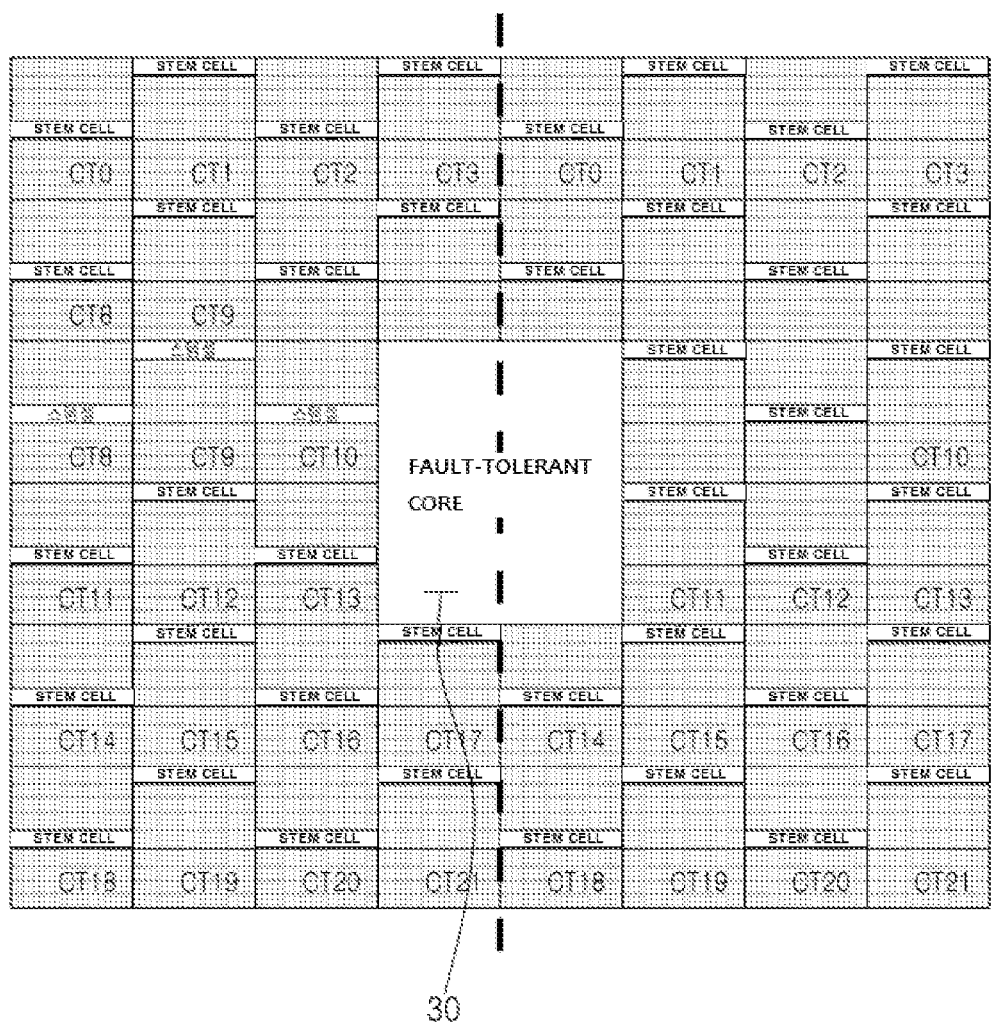

FIGS. 22 and 23 are diagrams showing a self-healing bio-inspired fault-tolerant FPGA according to an embodiment of the present invention.

As shown in FIGS. 22 and 23, stem cells in neighboring computation tiles may be arranged in different lines.

Since areas of stem cells may be partially reconfigurable and nets cannot pass through the partially reconfigurable areas, the stem cells in the neighboring tiles must have different arrays of stem cells. When the stem cells are arranged in the same row, the right half and the left half of each tile can communicate with only the corresponding tile itself and cannot communicate with the neighboring tile.

In FIG. 23, in order for each tile to identify which tile has a permanent fault, both halves of the FPGA are indicated by their unique IDs, that is, CT0, CT1, . . . , CT21. High preference for permanent fault correction may be assigned to one of CT0 and CT43 in all tiles. When a highest preference is assigned to CT0 and a lowest preference is assigned to CT43, if permanent faults are assumed to occur in CT [0:7], an error occurring in CT4 must wait until permanent errors in CT[0:3] are corrected. In order to prevent such a situation, as shown in FIG. 23, the FPGA may be divided into two halves, and individual tiles of both halves of the FPGA are indicated by their unique IDs, that is, CT0, CT1, to CT21 in order to identify tiles having permanent faults. If high priority is assigned to the left half of the FPGA depending on the above-described false scenario, CT0 of the left half will be healed first, and CT0 (CT4 in FIG. 23) of the right half may be subsequently healed. That is, sequentially, CT1 in the left half is first healed, and CT1 in the right half is then healed. Similarly, the FPGA may be divided into four areas so as to improve permanent error correction.

Such a fault-tolerant FPGA is controlled by a fault-tolerant core. In order to use an existing architecture together with fault-tolerant ability, the core may be initialized and arranged at the center of the FPGA.

Figure 24:
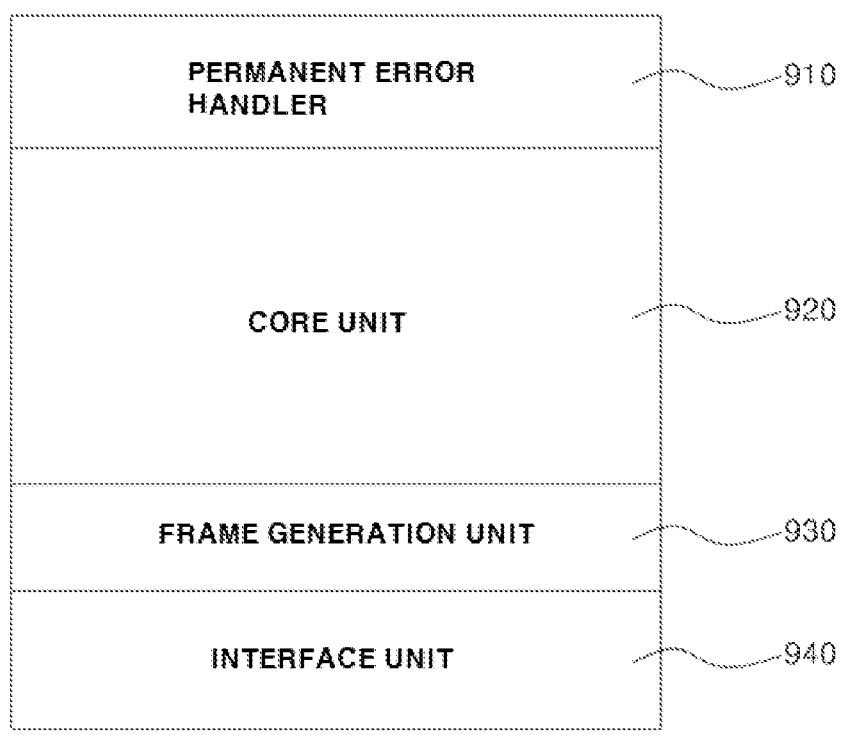
FIGS. 24 and 25 are diagrams showing the internal components of a fault-tolerant core shown in FIGS. 22 and 23.
Figure 25:
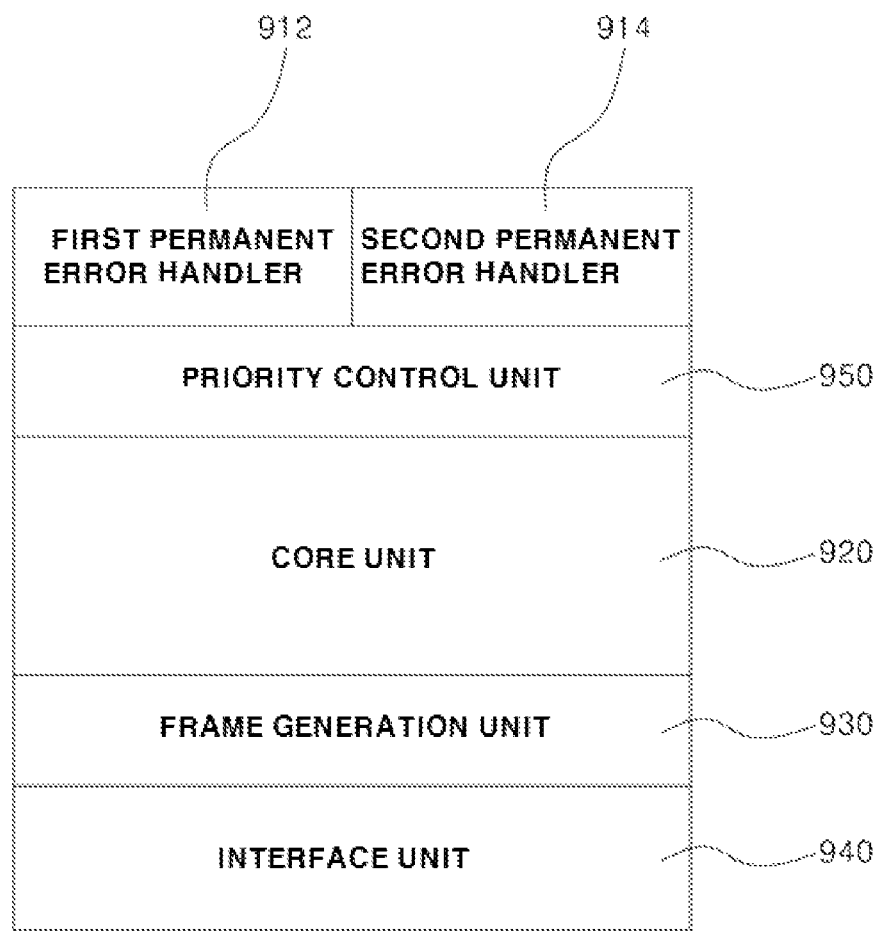
Figure 26:
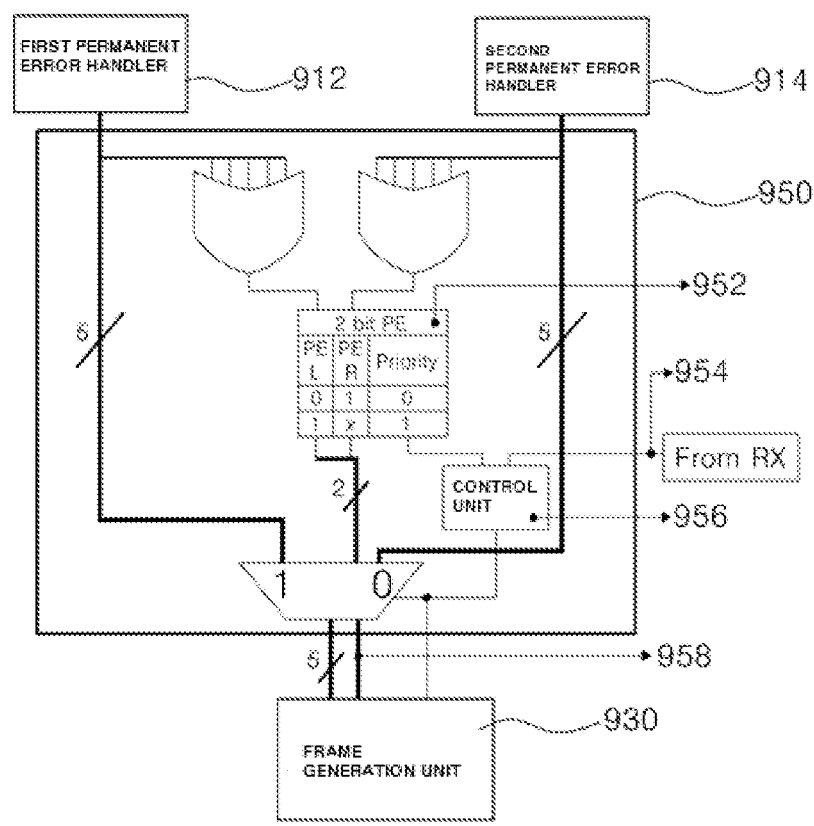
FIG. 26 is a block diagram showing the internal structure of a priority control unit.
Figure 27:
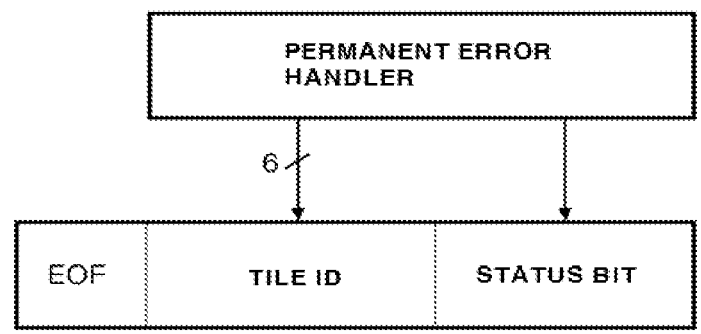
FIGS. 27 and 28 are diagrams showing frames generated by frame generators shown in FIGS. 22 and 23.
Figure 28:
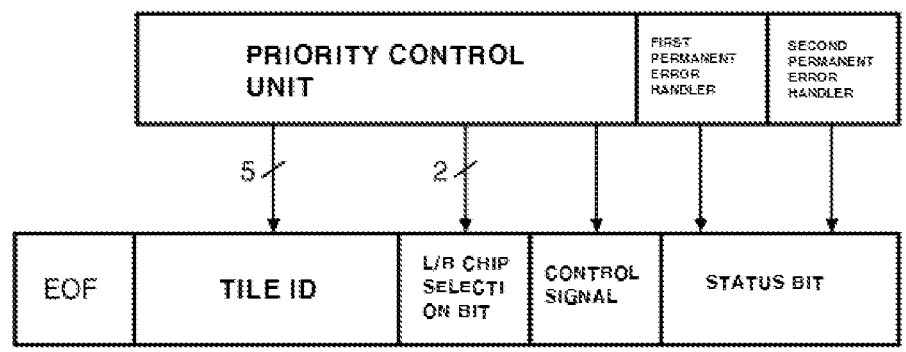

FIGS. 24 and 25 are diagrams showing the internal components of the fault-tolerant cores shown in FIGS. 22 and 23, FIG. 26 is a diagram showing a priority control unit shown in FIG. 23, and FIGS. 27 and 28 are diagrams respectively showing frames generated by the frame generation units shown in FIGS. 24 and 25.

Referring to FIGS. 24 to 28, the fault-tolerant core 30 may include a permanent error handler 910, a core unit 920, a frame generation unit 930 and an interface unit 940.

FIG. 24 is a diagram illustrating an example in which areas managed by a fault-tolerant core are not divided, as in the FPGA shown in FIG. 22, and FIG. 25 is a diagram illustrating an example in which a fault-tolerant core 30 is divided into two areas, as in the FPGA shown in FIG. 23.

First, as shown in FIG. 24, the fault-tolerant core 30 may include the permanent error handler 910, the core unit 920, the frame generation unit 930, and the interface unit 940.

In detail, the permanent error handler 910 generates tile IDs of computation tiles, each including a permanent error in a single computation cell or multiple computation cells. Further, the permanent error handler 910 generates a status bit. The permanent error handler 910 may include at least one priority encoder. The priority encoder determines which tile is to be healed first when permanent errors simultaneously occur in two or more of the tiles and then outputs a signal.

The frame generation unit 930 generates a frame including sufficient information that is used by online software so as to correct permanent errors via dynamic partial reconfiguration. For example, as shown in FIG. 27, the frame generation unit 930 may generate a frame composed of three fields. As shown in FIG. 27, computation tile IDs included in the frame may contain the tile IDs of faulty computation tiles that are output from the permanent error handler 910 having a 6-bit width via the interface.

Here, the status bit has a value of 0 or 1 taken from the permanent error handler 910. Here, a status bit of "0" may indicate that a permanent error is not present, and a status bit of "1" may indicate that a permanent error is present.

The core unit 920 takes charge of the entire control of the fault-tolerant core 30. The core unit 920 provides the generated frame to the online software via the interface unit 940.

Another embodiment of the fault-tolerant core 30 may be implemented, as shown in FIG. 25.

Referring to FIG. 25, the fault-tolerant core 30 has the same components as that of FIG. 24, except that the permanent error handler 910 of FIG. 24 is divided into two parts in FIG. 25. Each of permanent error handlers 912 and 914 may include a priority encoder.

The first permanent error handler 912 takes charge of the right area of a virtual center line of the FPGA, and the second permanent error handler 914 takes charge of the left area thereof.

The first permanent error handler 912 and the second permanent error handler 914 are configured to generate status bits based on the input signals.

Each of the first permanent error handler 912 and the second permanent error handler 914 may include a priority encoder. The priority encoder included in the first permanent error handler 912 determines which tile is to be healed first when permanent errors simultaneously occur in two or more of left tiles of the FPGA. Similarly, the second permanent error handler 914 makes the same determination for the right half area.

The priority control unit 950 may generate computation tile IDs of computation tiles including permanent errors in a single computation cell or multiple computation cells. Further, the priority control unit 950 may provide priority to the left area when errors simultaneously occur in the two areas of the FPGA. However, the priority control unit 950 may also provide priority to the right area depending on the user's setting. As shown in FIG. 9, the priority control unit 950 may include two OR gates, a 2-1 priority encoder 952, and a control module 956. Here, it is apparent that, upon individually controlling four areas of the FPGA, four OR gates, a 4-1 encoder, and a control module may be provided.

For example, the priority control unit 950 may receive signals output from the priority encoder and indicates whether faults are present in both halves of the FPGA or whether a fault is present in any one half of the FPGA. The control module 956 is an AND gate, one input 954 of which simply has a value of 1 as a default. The signal output from the control module indicates to which half of the FPGA the tile IDs belong.

If it is assumed that errors are present in both halves of the FPGA (the value of the priority encoder 952 will be 11), the output of the control module 952 will be 1, and the online software will first correct errors present in the left half. After all errors in the left half have been corrected, the online software deasserts an external signal so as to select the right half of the FPGA.

The frame generation unit 930 may generate a frame including sufficient information that is used by online software in order to correct permanent errors via dynamic partial reconfiguration. In this case, the core unit 920 provides the frame to the online software through the series interface unit 940.

As shown in FIG. 28, the frame generation unit 930 generates tile IDs, status bits, control signals, L/R chip selection bits, etc. For example, as shown in FIG. 28, the frame generated by the frame generation unit 930 is composed of four fields.

The tile IDs may contain the tile IDs of faulty tiles input from the priority control unit through the interface.

The L/R chip selection bits store information about which half of the FPGA has errors, and may be fed from the priority control unit 950 through the interface. In this case, "10" indicates that any one of tiles arranged in the left half has an error, "01" indicates that any one of tiles arranged in the right half has an error, and "11" indicates that tiles in both halves have errors.

The control signals indicate to which area (half) of the FPGA the data of the tile IDs belongs, and is fed from the priority control unit 950 through the interface. Here, "0" denotes a right area of the FPGA and "1" denotes a left area of the FPGA.

The status bits are values taken from the first and second permanent error handlers 914 for both areas through the interface. In this case, "00" denotes the non-presence of a permanent error, "01" denotes the presence of a permanent error in the right area, "10" denotes the presence of a permanent error in the left area, and "11" denotes the presence of permanent errors in both areas.

Such status bits are suitable for the purpose of a Start of Frame (SOF) field. The online software processes the frame only when a value other than "0" is present in the field, otherwise the frame is discarded.

As described above, the FPGA according to the embodiment of the present invention is capable of reconfiguring look-up tables included in a stem cell and a computation cell, and outputting a normal output signal even if a transient fault or a permanent fault occurs in a computation cell, thus enabling the corresponding computation cell and the corresponding computation tile to be normally operated.

Further, the FPGA according to the embodiment of the present invention allows a core to separately control individual areas of computation tiles, thus improving efficiency.

The present invention relates to a computation cell and a self-healing fault-tolerant FPGA architecture, and may provide a computation cell that receives an original function and a spare function, compares a pre-stored error detection code with a generated error detection code, and detects an internal transient fault or permanent fault; and a self-healing fault-tolerant FPGA architecture. The computation cell and the self-healing fault-tolerant FPGA architecture according to the present invention have industrial applicability because it is possible to reconfigure look-up tables included in a stem cell and a computation cell, and output a normal output signal even if a transient fault or a permanent fault occurs in each computation cell, thus enabling the corresponding computation cell and the corresponding computation tile to be normally operated.

The invention claimed is:

1. A computation cell for a fault-tolerant field programmable gate array (FPGA), comprising:
   an original function/error detection code storage unit for storing an original function, or storing an error detection code-1 corresponding to the original function, and for outputting an original function output required to do routing the original function and an error detection code-1 required to detect an error in the original function when the original function is input;
   a spare function/error detection code storage unit for storing a spare function or storing an error detection code-2 corresponding to the spare function, and outputting a spare function output required to do routing the spare function and an error detection code-2 required to detect an error in the spare function when the spare function is input;
   a totally self checker comprising:
      an error detection code generator for performing an operation on the original and spare function outputs and generating an error detection code for original function required to detect an operation of the original function or occurrence of a unidirectional fault and an error detection code for spare function required to detect an operation of the spare function or occurrence of a unidirectional fault; and
      a fault checker for performing an operation on the error detection code-1, the error detection code-2, the error detection code for original function, and the error detection code for spare function and generating a faulty signal_original and a faulty signal_spare required to determine occurrence of errors in the original and spare functions, respectively;
   a function router/permanent error indicator for performing an operation on the original function output, the spare function output, the faulty signal_original, the faulty signal_spare, and a stem function input from a stem cell, and then outputting a function routing signal or a permanent error flag signal;
   a free router for routing the permanent error flag signal;
   a free look-up table-1 including a router for routing a permanent error signal or at least one look-up table for storing the error detection code-1 corresponding to the original function, depending on the number of bits of the original function; and
   a free look-up table-2 including a router for routing a permanent error signal or at least one look-up table for storing the error detection code-2 corresponding to the spare function, depending on the number of bits of the spare function,
   wherein, when the original and spare functions are k-bit functions, the original and spare function/error detection code storage units store the original function and the spare function, respectively, and
   the free look-up table-1 and free look-up table-2 pre-store the error detection code-1 and error detection code-2, respectively when the original and spare functions are functions of k−1 or less bits, the free look-up table-1 and free look-up table-2 do routing the permanent error signal.

2. The fault-tolerant FPGA computation cell of claim 1, wherein the original function/error detection code storage unit comprises:
   a first look-up table for storing the original function;
   a second look-up table for pre-storing the error detection code-1 corresponding to the original function and outputting the pre-stored error detection code-1 when the original function is input; and
   a first multiplexing unit for performing an operation on a signal output from the first look-up table, a Most Significant Bit (MSB) of the original function, and a signal output from the second look-up table, and then outputting the original function output.

3. The fault-tolerant FPGA computation cell of claim 1, wherein the spare function/error detection code storage unit comprises:
   a third look-up table for storing the spare function;
   a fourth look-up table for pre-storing the error detection code-2, and outputting the pre-stored error detection code-2 when the spare function is input; and
   a second multiplexing unit for performing an operation on a signal output from the third look-up table, an MSB of the spare function, and a signal output from the fourth look-up table, and then outputting the spare function output.

4. The fault-tolerant FPGA computation cell of claim 1, wherein the function router/permanent error indicator comprises:
   a function router for receiving the faulty signal_original and faulty signal_spare, the original and spare function outputs, and the stem function, and routing the original function or the spare function having no fault when the original or spare function does not have a fault; and
   a permanent error indication unit for, when errors occur in both the faulty signal_original and faulty signal_spare, outputting the permanent error flag signal.

5. The fault-tolerant FPGA computation cell of claim 1, wherein each of the original and spare function/error detection code storage units includes a reconfigurable look-up table.

6. A field programmable gate array (FPGA), comprising:
a plurality of computation cells, each of which is the computation cell of claim 1;
at least one stem cell connected to the computation cells and configured to, when a permanent fault occurs in at least one of the computation cells, take over functionality of said one of the computation cells;
a plurality of computation tiles, each being configured such that the plurality of fault-tolerant FPGA computation cells and a plurality of stem cells are arranged in the computation tile; and
a fault-tolerant core configured to control the computation tiles.

7. The FPGA of claim 6, wherein the stem cells are arranged in a direction of rows or columns in an identical line within the computation tile, and stem cells in neighboring computation tiles are arranged in different lines.

8. The FPGA of claim 6, wherein the core divides the plurality of computation tiles into areas and separately controls the computation tiles for respective areas.

9. The FPGA of claim 6, wherein the original function is any Boolean function represented by logic, and the spare function is a function that replaces the original function.

10. A field programmable gate array (FPGA), comprising:
a plurality of computation cells, each of which is the computation cell of claim 1;
at least one stem cell connected to the computation cells, the stem cell having stem functions respectively corresponding to the computation cells connected to the stem cell, the stem functions being partially reconfigured, when a permanent fault occurs in at least one of the computation cell, to take over functionality of said at least one of the computation cell;
at least one computation block in which each stem cell and the plurality of fault-tolerant FPGA computation cells are connected and arranged in a line;
a plurality of computation tiles, each being configured such that a plurality of computation blocks are arranged in a horizontal or vertical direction in the computation tile; and
a fault-tolerant core for, when permanent faults occur in at least two of the plurality of computation tiles, setting priorities of the computation tiles in which the permanent faults are detected, and performing control such that the permanent faults are corrected depending on the priorities.

11. The FPGA of claim 10, wherein the fault-tolerant core comprises:
a permanent error handler for generating a status signal required to determine whether a permanent error has occurred; and
a frame generation unit for generating a frame using the status signal and tile IDs of computation tiles in which the permanent error has occurred.

12. The FPGA of claim 11, wherein the fault-tolerant core is configured such that the permanent error handler generates information about the tile IDs and provides the tile ID information to the frame generation unit.

13. The FPGA of claim 11, wherein the fault-tolerant core further comprises:
a plurality of permanent error handlers; and
a priority control unit for providing tile ID information of preset computation tiles to the frame generation unit.

14. The FPGA of claim 11, wherein the frame generation unit generates a frame including a start frame field, a tile ID field, and a status field, wherein the frame is processed only when the start frame field has a value other than 0, otherwise the frame is discarded.

15. The FPGA of claim 11, wherein the permanent error handler includes at least one priority encoder.

16. The FPGA of claim 10, wherein the stem cell is arranged in an area corresponding to any one of an uppermost portion, a lowermost portion, and a center portion of the computation block.

* * * * *